United States Patent [19]

Majima et al.

[11] Patent Number: 4,597,826

[45] Date of Patent: Jul. 1, 1986

[54] METHOD FOR FORMING PATTERNS

[75] Inventors: Teiji Majima, Hatano; Hiromichi Watanabe, Atsugi, both of Japan

[73] Assignee: Fujitsu Limited, Kawasaki, Japan

[21] Appl. No.: 686,521

[22] Filed: Dec. 26, 1984

[30] Foreign Application Priority Data

Dec. 26, 1983 [JP] Japan .................. 58-244334
Dec. 28, 1983 [JP] Japan .................. 58-245287
Oct. 4, 1984 [JP] Japan .................. 59-208784

[51] Int. Cl.$^4$ .......................... C23F 1/02; B44C 1/22; C03C 15/00; C03C 25/06
[52] U.S. Cl. .................. 156/643; 156/651; 156/652; 156/656; 156/661.1; 204/192 EC; 204/192 E; 204/298; 365/1; 427/127
[58] Field of Search ............ 148/1.5, 187; 365/1, 365/18, 19, 23, 24, 29, 32; 156/643, 646, 650, 651, 652, 655, 656, 657, 659.1, 661.1; 427/85, 130, 131, 132, 127; 118/730, 731, 50.1, 620; 204/164, 192 EC, 192 E, 298

[56] References Cited

U.S. PATENT DOCUMENTS 3,563,809 2/1971 Wilson .................. 148/1.5
4,053,349 10/1977 Simko .................. 156/661.1 X

OTHER PUBLICATIONS

IBM Technical Disclosure Bulletin, vol. 21, No. 11, Apr. 1979, Platinum Contact/Chromium Barrier Metallurgical Processing Technique by Ion Milling, pp. 4503-4504.

*Primary Examiner*—William A. Powell
*Attorney, Agent, or Firm*—Staas & Halsey

[57] ABSTRACT

A method is disclosed of forming a fine pattern on a substrate, in which an etching mask pattern is formed on a layer of material of a pattern to be formed, an overlying layer is deposited on the pattern material layer and the mask pattern, and thereafter, the overlying layer and the pattern material layer are etched by ion etching. This method makes it possible, due to the pattern-widening effect caused by the deposition of the overlying layer and by the use of ion etching, to form a pattern having a gap smaller than 0.5 μm or a contiguous-disk pattern having a period of 2 μm or less by photolithography having a 1 μm resolution. It is also possible to form a pattern adapted to enable an easy planing process, by utilizing a difference in etching rates between the mask pattern and the overlying layer. An apparatus used for carrying out the pattern forming method comprises film layer forming means and ion etching means, whereby the overlying layer forming step and the ion etching step can be successively performed by using one and the same apparatus.

26 Claims, 72 Drawing Figures

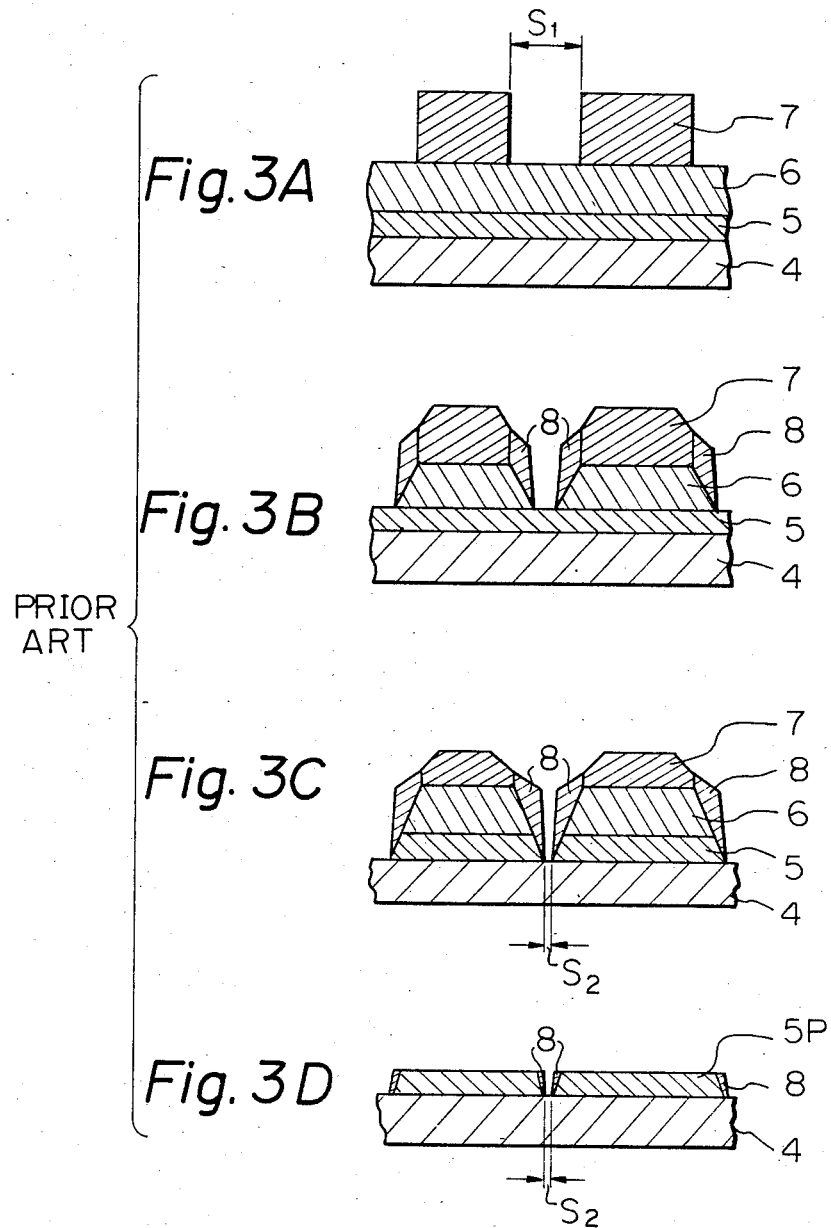

METHOD FOR FORMING PATTERNS

BACKGROUND OF THE INVENTION

1. Field of the Invention

The present invention relates to a microfabrication technique which may be advantageously used for manufacturing various kinds of devices, such as a magnetic bubble memory device, a semiconductor device, a surface acoustic wave device, or a Josephson device. More particularly, the present invention relates to a method for forming a pattern of a material, such as a conductive material or magnetic material, for example, on a substrate of the device, and to an apparatus adapted for being advantageously used for carrying out the above-mentioned method.

2. Description of the Related Art

In the formation of patterns in the devices as mentioned above, several important problems arise. One of these problems concerns making a fine pattern for improving the characteristics for and reducing the size or increasing the density of the device. For example, in a permalloy bubble memory device in which a bubble propagation path is defined by a permalloy pattern constituted by permalloy elements arranged with gaps therebetween, the width of the gap between the adjacent permalloy elements is one of the factors with determine the bubble propagation characteristics, and it is advantageous to make the gap width as small as possible. However, as described hereinafter, it is very difficult to form a gap of less than 1 $\mu$m (submicron gap), in particular, of 0.5 $\mu$m or less, using conventional techniques. Accordingly, under the existing circumstances, it is necessary to pursue improvements in the propagation characteristics and memory density of the permalloy bubble memory device by using newly-designed patterns having gaps of 1 $\mu$m or more. In this connection, the T-I pattern, chevron pattern, or the like, were used at the early stages. At the present stage, however, the so-called gap-tolerant pattern, e.g., half-disk pattern and asymmetric chevron pattern, are used, whereby a bubble memory having a 2 $\mu$m bubble diameter, 8 $\mu$m bit period, and 1 Mbit memory density, is achieved. Furthermore, recently, the so-called wide-gap pattern has been proposed as an approach to realize a bubble memory having a 1 $\mu$m bubble diameter, 4 $\mu$m bit period, and 4 Mbit memory density. However, to achieve a further improvement in operating characteristic and memory density, the gaps in the permalloy pattern must be made smaller than 1 $\mu$m, in particular, smaller than 0.5 $\mu$m.

Further, there is a well-known ion-implanted bubble memory device in which, in order to overcome the above-mentioned gap problem, the bubble propagation path is defined by a contiguous-disk pattern formed by using an ion-implantation technique. The contiguous-disk pattern is constituted by contiguously arranged or overlapped patterns having a relatively simple shape, such as round, oval, or square. Therefore, the contiguous-disk pattern basically requires no gap for separation of the adjacent patterns and is simple in shape, thus making it possible to form a pattern having a smaller bit period than the permalloy pattern, by using a conventional technique. At present, a 4 $\mu$m period pattern for the propagation of 1 $\mu$m diameter bubble has been achieved. However, in achieving a contiguous-disk pattern with a period smaller than 4 $\mu$m, in particular, a period of 2 $\mu$m or less, the problem described below occurs.

In the contiguous-disk pattern, the shape of the cusps defined by the contiguous or overlapped disk patterns is one of the factors deciding the bubble propagation characteristics. However, a 2 $\mu$m period pattern has cusps too minute to be precisely formed by using a conventional technique. It should be noted that, in the pattern forming art, it can be deemed that the cusp is a kind of gap and, accordingly, the gap forming technique described hereinafter includes the cusp forming technique.

Another problem in the forming of a pattern in the devices as mentioned above concerns a sectional configuration of the pattern. In many of these devices, a plurality of patterns are deposited one above the other. In these circumstances, to prevent inferiorities such as disconnection of the overlying pattern, a planing process must be performed by coating a resin over the underlying pattern. However, according to a conventional pattern forming method, it is impossible to control the sectional configuration of a pattern in such a manner that the sides of the pattern have a gentle slope. Accordingly, the pattern planing process cannot be easily performed.

Fine patterns, such as the permalloy pattern and contiguous-disk pattern are conventionally formed by using lithographic techniques employing light, X-rays, or an electron beam (hereinafter, generically referred to as "photolithography"). According to a conventional pattern forming method, first, a layer of material from which a pattern is formed (i.e., pattern material layer) is deposited on a surface of a substrate of a device. Next, a mask pattern used for the etching is formed of a photoresist material on the pattern material layer by photolithography. Thereafter, the pattern material layer is etched to form the pattern. According to this method, the smallest size of the formed pattern which is attainable basically depends on the limit of the mask pattern forming technique, i.e., of the photolithography. Recently, photolithography techniques have remarkably advanced, but the limit of their practical resolution is 1 $\mu$m. Accordingly, it is very difficult to form a submicron gap by using the conventional pattern forming method mentioned above.

On the other hand, there are some known methods for forming a submicron gap by employing photolithography having a 1 $\mu$m resolution. One of these methods uses the technique of shortening the time of the optical exposure of the pattern onto the photoresist material in the mask pattern forming process. That is, a positive photoresist material is used and the exposure time is shorter than the normal time, whereby it is possible to form a mask pattern having a submicron gap and, thus, a submicron pattern gap, under the condition of a 1 $\mu$m resolution. However, the shortening of the exposure time is naturally limited, since an inferior patterning of the mask pattern is apt to occur, due to variations in the amount of light and the size of the exposed pattern.

Another known method uses an etching technique employing energized particles, for example, an ion etching technique. An ion etching process presents the phenomenon wherein a part of the material removed from the pattern material layer is redeposited onto the mask pattern and the pattern material layer and, as a result, the effect is obtained that the pattern is widened, and thus the pattern gap is correspondingly narrowed. Therefore, it is possible to form a submicron gap pattern on the basis of a 1 $\mu$m gap mask pattern. However, according to the conventional pattern forming method, an effective pattern-widening effect (i.e., gap-narrowing effect) cannot be obtained, even if the ion etching technique is used, as described hereinafter.

Moreover, even if both pattern-widening effects caused by the shortening of the exposure time and the ion etching technique are combined, the smallest gap width which can be obtained by the conventional pattern forming method is 0.5 $\mu$m. In addition, a very high level process control technique is required for the above, and this is not suitable to practical use.

A further known method is disclosed in Japanese Unexamined Patent Publication (Kokai) No. 54(1979)-155771. This method basically utilizes the above-mentioned pattern-widening effect caused by ion etching. That is, a pattern gap control layer is deposited on the pattern material layer, and a mask pattern is formed on the pattern gap control layer. Thereafter, the pattern gap control layer and the pattern material layer are ion-etched, so that a pattern-widening effect is obtained and, accordingly, a pattern gap which is smaller than the mask pattern gap is formed. However, this method has problems in that the process of forming the pattern gap control layer and the etching process are expensive, and processing takes a long time. And that further, the process of removing the mask pattern and the pattern gap control layer after the etching process has been completed is complicated, as described hereinafter with reference to the drawings. Therefore, this method is disadvantageous from the viewpoint of production efficiency.

Furthermore, according to the conventional and known pattern forming methods, the sectional configuration of the formed pattern depends, in principle, on the etching technique and also cannot be controlled. Therefore, a pattern formed by the conventional and known methods has a sectional configuration with the sides thereof being steeply sloped, thereby making it difficult to perform the planing process.

SUMMARY OF THE INVENTION

It is a primary object of the present invention to provide a pattern forming method by which a pattern having submicron gaps or cusps exceeding the size limitations imposed by photolithography can be easily and efficiently formed. Another object of the present invention is to provide a pattern forming method by which the sectional configuration of a pattern can be controlled so that the sides of the pattern are gently sloped and, thus, the planing process can be easily performed.

A further object of the present invention is to provide an apparatus which is advantageously used for carrying out the above-mentioned methods according to the present invention.

According to one feature of the present invention, there is provided a method for forming a pattern having a fine gap on a substrate, comprising the steps of: depositing a layer of material, from which the pattern is formed, on the surface of the substrate; forming an etching mask pattern having a first gap on the pattern material layer; depositing a pattern-widening overlying layer on the exposed surfaces of the pattern material layer and the mask pattern, so that the undulation of the mask pattern is substantially maintained, thereby reforming said first gap into a second smaller gap; and etching the overlying layer and the pattern material layer by ion etching employing energized particles of an inert gas, thereby forming a pattern having a fine gap smaller than the second gap from the pattern material layer.

According to this method, a large pattern-widening effect is caused by both the deposition of the pattern-widening overlying layer and the ion etching, and accordingly, it is possible to form a pattern having a fine gap of 0.5 $\mu$m or less, on the basis of an etching mask pattern having a gap of 1 $\mu$m or more formed by photolithography.

Moreover, according to an embodiment of this method, it is possible to form a contiguous-disk pattern having a fine cusp on the basis of an etching mask pattern having a gap of 1 $\mu$m or more.

According to another feature of the present invention, there is provided a method for forming a pattern of material on a substrate, comprising the steps of: depositing a layer of pattern material on the surface of the substrate; forming an etching mask pattern covering regions substantially corresponding to the pattern to be formed on the pattern material layer; depositing an overlying layer of material having an etching rate larger than that of the mask pattern material on the exposed surfaces of the pattern material layer and the mask pattern, so that the undulation of the mask pattern is substantially maintained; and etching the overlying layer and the pattern material layer by ion etching employing energized particles of an inert gas, thereby forming the pattern from the pattern material layer.

According to this method, the pattern material layer is etched stepwise, due to the difference in the etching rate between the mask pattern and the overlying layer, and accordingly, it is possible to form a pattern having side surfaces being gently sloped, thereby enabling the planning process to be easily performed.

According to a further feature of the present invention, there is provided an apparatus comprising: a vacuum chamber; a substrate holder for holding a substrate to be processed within the vacuum chamber; means for forming a layer of film on the substrate; and means for etching the film layer on the substrate by ion etching.

According to this apparatus, in carrying out the pattern forming methods of the present invention described above, it is possible to successively perform the overlying-layer forming step and the step of ion etching of the overlying layer and the pattern material layer, by using one and the same apparatus, whereby an improvement in quality and production efficiency can be achieved.

The present invention is now described in detail based on the preferred embodiment and in comparison with the prior art, with reference to the accompanying drawings.

BRIEF EXPLANATION OF THE DRAWINGS

FIGS. 3A through 3D illustrate a basic process of another conventional pattern-forming method;

FIGS. 12A through 12C illustrate a known ion-implanted magnetic bubble memory device, wherein FIG. 12A is a partial plan view, and FIGS. 12B and 12C are sectional views taken along lines B—B and C—C, respectively, in FIG. 12A;

DESCRIPTION OF THE PREFERRED EMBODIMENTS

Figure 1A:
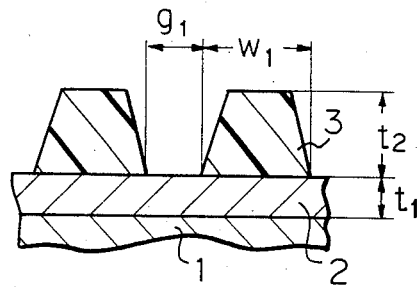
FIGS. 1A through 1C illustrate a basic process of a conventional pattern forming method.
Figure 1B:
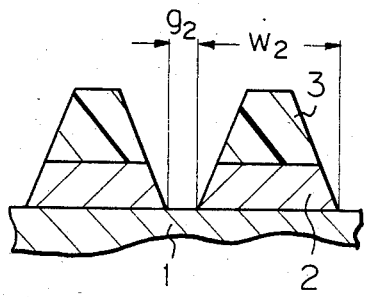
Figure 1C:
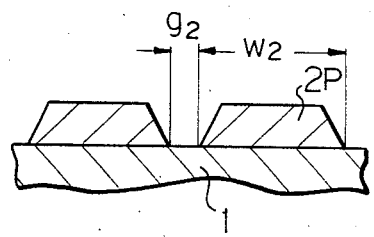

First, pattern forming methods according to the prior art will be described. A basic process of a conventional method is illustrated in FIGS. 1A through 1C. Referring first to FIG. 1A, a pattern material layer 2 is deposited on a substrate 1 by vapor deposition. On the pattern material layer 2, an etching mask pattern 3 having a thickness of $t_2$ is formed of a photoresist by photolithography. The reference character $g_1$ designates the width of a gap (at the bottom of the gap or the interface of the mask pattern 3 and the material layer 2) of a gap of the mask pattern 3. Next, the pattern material layer 2 is etched as illustrated in FIG. 1B, and, finally, the mask pattern 3 is removed, so that a desired pattern 2P is formed on the substrate 1 as illustrated in FIG. 1C. The reference character $g_2$ designates the gap width of a gap (at the bottom of the gap or the interface of the material layer 2 and the substrate 1) of a gap of the pattern 2P.

When forming a permalloy propagation pattern of a permalloy bubble memory device, for example, according to the above-mentioned method, the pattern material layer 2 is made of permalloy with the thickness $t_1$ of 3,000 Å, and the mask pattern 3 is formed of a positive photoresist material, for example, "AZ1350J" (Shipley company) with the thickness $t_2$ of 6,750 Å. In this case, if the exposure time for the photoresist material is set at the normal time, the gap width $g_1$ of the mask pattern 3 has the limit of 1 $\mu$m. Moreover, if chemical etching is used to etch the permalloy layer 2, the gap width $g_2$ of the permalloy pattern 2P also has the limit of 1 $\mu$m. Therefore, a submicron gap cannot be formed.

Figure 2:
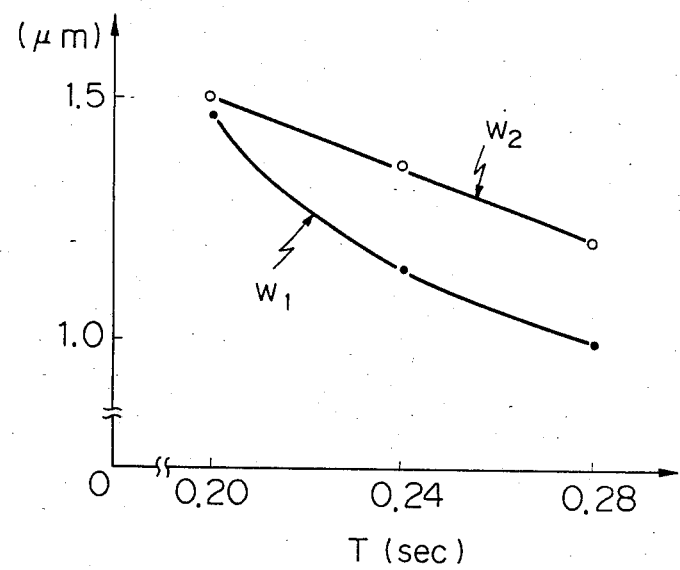
FIG. 2 is a graph illustrating the pattern-widening effects caused by the shortering of the pattern exposure time and the ion etching in the conventional method.

On the other hand, as described hereinbefore, if the pattern exposure time of the photoresist is shorter than normal, the mask pattern gap width $g_1$ can be made smaller than 1 $\mu$m. As also described hereinbefore, by employing ion etching, the pattern width of the permalloy pattern 2P can be made wider than that of the mask pattern 3, with the result that the permalloy pattern gap width $g_2$ can be made narrower than the mask pattern gap width $g_1$. Referring to FIG. 2, there is illustrated the mask pattern width (at the bottom) $w_1$ and the permalloy pattern width (at the bottom) $w_2$, in relation with the exposure time T, in the example in which the mask pattern 3 is formed by exposing a pattern having a pattern width and gap width which are both 1 $\mu$m, and ion etching is used to form the permalloy pattern 2P. It can be understood from FIG. 2 that, if the exposure time is shortened, the mask pattern width $w_1$ is made wider than 1 $\mu$m (i.e., the mask pattern gap width $g_1$ is narrower than 1 $\mu$m), and also that the permalloy pattern width $w_2$ is wider than the mask pattern width $w_1$, due to the pattern-widening effect caused by ion etching. For example, in the case of an exposure time of T=0.20 sec, the mask pattern width $w_1$ is 1.46 $\mu$m and the permalloy pattern width $w_2$ is 1.50 $\mu$m, whereby the permalloy pattern gap width $g_2$ is 0.5 $\mu$m. However, as described hereinbefore, the shortening of the exposure time is naturally limited. Moreover, although an increased mask pattern thickness $t_2$ contributes to the increase of the pattern-widening effect caused by the ion etching, a thickness $t_2$ which is too large causes the permalloy redeposited onto the mask pattern to form a wall at the edge of the permalloy pattern 2P, thereby resulting in an inferior patterning. Consequently, according to the conventional methods, if pattern-widening effects (i.e., gap-narrowing effect) caused by both the shortening of the exposure time and the ion etching are combined, the smallest pattern gap width which can be formed by photolithography having a 1 $\mu$m resolution, is approximately 0.5 $\mu$m.

A process of the pattern forming method disclosed in the above-mentioned Japanese Unexamined Patent Publication No. 54(1979)-155771 is illustrated in FIGS. 3A through 3D. Referring first to FIG. 3A, on a substrate 4, a pattern material layer 5 and a pattern gap control layer 6 are successively deposited. Further, on the pattern gap control layer 6, an etching mask pattern 7 having a gap width $S_1$ is formed. Thereafter, as illustrated in FIG. 3B, the pattern gap control layer 6 is etched, and, as illustrated in FIG. 3C, the pattern material layer 5 is then etched, and, finally, as illustrated in FIG. 3D, the mask pattern 7 and the pattern gap control layer 6 are removed, so that a pattern 5P is formed. In this process, ion etching is used, so that a part of the etched material is redeposited, as designated by the reference numeral 8, on the sides of the mask pattern 7, the pattern gap control layer 6 and the pattern material layer 5, thereby widening the pattern. Thus, the gap width $S_2$ of the pattern 5P after the etching has been finished is narrower than the original gap width $S_1$ of the mask pattern 7. The above-mentioned publication discloses an embodiment of this method used to form a permalloy bubble propagation pattern, in which the pattern material layer 5 is made of permalloy and has a 0.4 $\mu$m thickness, the pattern gap control layer 6 is made of gold (Au) and has a 1.0 $\mu$m thickness, the mask pattern 7 is formed from the photoresist material "AZ1350J" and has a 1.2 $\mu$m thickness, the initial gap width $S_1$ is 1.7 $\mu$m, and the pattern gap width $S_2$ is 0.5

μm. This publication also teaches that it is possible to control the pattern gap width $w_2$ by varying the thickness of the pattern gap control layer 6. Moreover, it is easy to anagolize that, if the initial gap width $S_1$ is 1 μm, the pattern gap width $S_2$ would be narrower than 0.5 μm. However, this method has the problems mentioned below. One of these problems is that the pattern-widening effect depends on ion etching only. Accordingly, in order to obtain a large pattern-widening effect, it is required to relatively increase the thickness of the pattern gap control layer 6, and thus the layer depositing time and the etching time are increased. Another problem is that the mask pattern 7 and the pattern gap control layer 6 must be removed after the etching process has been finished, and this removing process is expensive and requires much labour and time. Therefore, the production efficiency is low.

Next, the pattern forming methods according to the present invention will be described. A first embodiment of the present invention method is illustrated in FIGS. 4A through 4E and comprises the following steps.

Figure 4A:
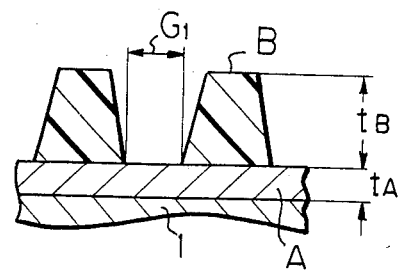
FIGS. 4A through 4E illustrate a basic process of a first embodiment of a pattern forming method according to the present invention.

(1) First, referring to FIG. 4A, on a substrate 1, a pattern material layer A having a thickness $t_A$ is deposited. Moreover, on the layer A, an etching mask pattern B of photoresist with a thickness $t_B$ is formed by photolithography. The reference character $G_1$ designates the initial gap width (at the bottom of the gap) of the mask pattern B.

Figure 4B:
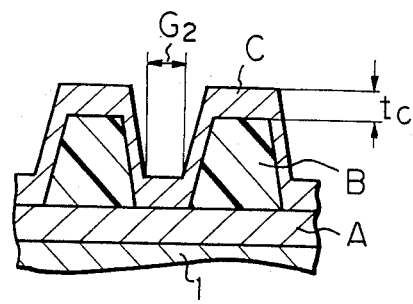

(2) Next, referring to FIG. 4B, a pattern-widening overlying layer C having a thickness $t_C$ is deposited on the exposed surfaces of the pattern material layer A and the mask pattern B, so that the undulation or topography of the mask pattern B is substantially maintained. This widens the mask pattern B and, thus, the gap width (at the bottom of the gap) $G_2$ is narrower then the initial gap width $G_1$.

Figure 4C:
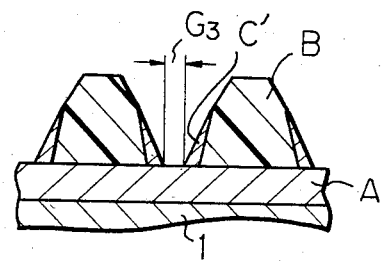

(3) Thereafter, referring to FIG. 4C, the overlying layer C is etched using an ion etching technique employing energized particles of an inert gas, such as Ne, Ar, or Xe. In this step, a part C' of the etched material of the overlying layer C is redeposited on the sides of the mask pattern B. Accordingly, the bottom portion of the mask pattern B is widened on each side by the thickness of the redeposited part C' and, thus, the gap width $G_3$ (at the bottom of the gap) is narrower than the gap width $G_2$ after the overlying layer has been formed.

Figure 4D:
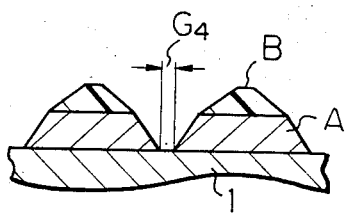
Figure 4E:
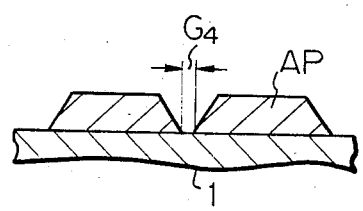

(4) The ion etching is continued, to etch the pattern material layer A as illustrated in FIG. 4D, and finally the mask pattern B is removed as illustrated in FIG. 4E, whereby a desired pattern AP is formed. The gap width $G_4$ (at the bottom of the gap) of the pattern AP is narrower than the mask pattern gap width $G_3$ after the etching of the overlying layer C, due to the pattern-widening effect caused by ion etching.

When forming a permalloy propagation pattern of a permalloy bubble memory device according to the above-mentioned present invention method, the pattern material layer A is made of a permalloy with a thickness $t_A$ of 3000 Å, and the mask pattern B is formed of the above-mentioned photoresist "AZ1350J". However, the thickness $t_B$ of the mask pattern is desirably larger than that in the conventional method described above with respect to FIGS. 1A-1C; most appropriately 10000 Å. This is because if the same thickness $t_B = 6{,}750$ Å as that in the conventional methods is used, it is impossible to obtain a satisfactory pattern-widening effect.

The overlying layer C can be made of various materials, such as Cu, NiFe (permalloy), Au, Ti, $Cr_2O_3$, $SiO_2$, Cr, or Si, which, in the main, may be chosen according to the adhesion to the mask pattern B and the etching rate. For example, where the pattern material layer A is made of permalloy, it is advantageous that the overlying layer C be made of Cu or NiFe.

The overlying layer C may be formed by vapor deposition or sputtering. In this process, a planetary substrate holder, for example, is used to cause the material of the overlying layer to be deposited on the substrate at an angle of 0° through 45° with respect to the normal line of the substrate, so that the thickness of the overlying layer C on the side surfaces of the mask pattern B is uniform and as thick as possible. Moreover, when forming the overlying layer C by vapor deposition, it is desirable to keep the substrate 1 at a low temperature (for example, 150° C. or less) in the vapor deposition process, thereby preventing any change in the quality and shape of the mask pattern B.

Figure 5A:
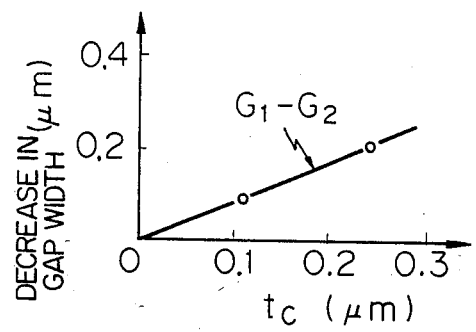
FIGS. 5A through 5C are graphs illustrating the gap-narrowing effect (i.e., pattern-widening effect) in the method of the present invention.
Figure 5B:
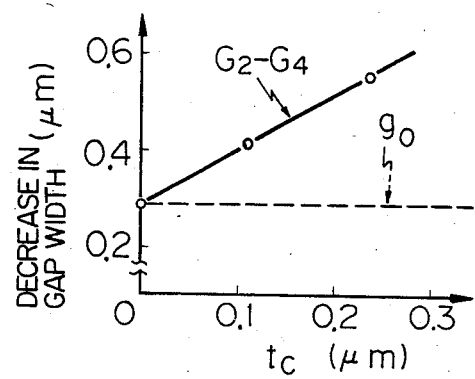
Figure 5C:
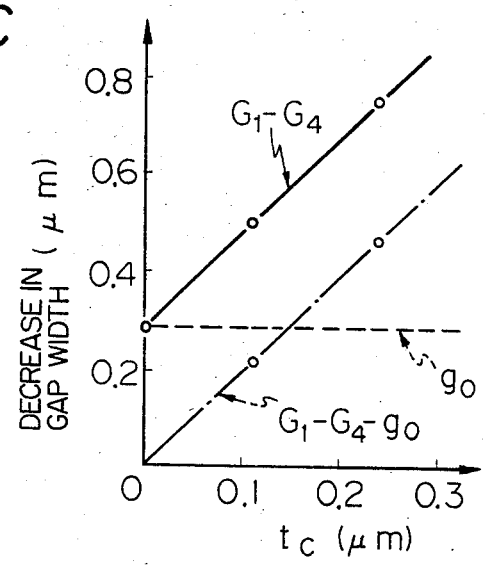

The above-described gap widths $G_2$, $G_3$, and $G_4$ depend on the thickness $t_C$ of the overlying layer C. FIGS. 5A through 5C illustrate the increase in pattern width, i.e., the decrease in gap width, of the mask pattern B and the permalloy pattern AP, in relation to the thickness $t_C$ of the permalloy overlying layer C, wherein the initial gap width $G_1$ of the mask pattern B is 1 μm. FIG. 5A shows the decrease ($G_1-G_2$) of the gap width $G_2$ after the overlying layer has been formed, compared with the original gap width $G_1$ of the mask pattern B. FIG. 5B shows the decrease ($G_2-G_4$) of the permalloy pattern gap width $G_4$, compared with the mask pattern gap width $G_2$ after the deposition of the overlying layer C. It should be noted that a dotted line $g_0$ in FIG. 5B shows the decrease in gap width achieved without the deposition of the overlying layer (i.e., $t_C = 0$), which corresponds to the decrease of the pattern gap width $g_2$, compared with the mask pattern gap width $g_1$ of 1 μm, in the above-mentioned conventional method illustrated in FIGS. 1A through 1C. Therefore, the difference ($G_2-G_4-g_0$) between ($G_2-G_4$) and $g_0$ defines an increase in the pattern-widening effect (i.e., gap-narrowing effect) in the etching process caused by the deposition of the overlying layer C. FIG. 5C shows the sum of the gap-width decrease ($G_1-G_2$) shown in FIG. 5A and the gap-width decrease ($G_2-G_4$) shown in FIG. 5B, i.e., the total decrease ($G_1-G_4$) of the permalloy pattern gap width $G_4$, compared with the initial gap width $G_1$ of the mask pattern, as well as the difference between the total gap-width decrease ($G_1-G_4$) and the gap-width decrease $g_0$ achieved without the deposition of the permalloy overlying layer C, i.e., the gap-width decrease ($G_1-G_4-g_0$) caused by the deposition of the permalloy overlying layer C.

As can be seen from the figures, according to the conventional method illustrated in FIGS. 1A through 1C, without the deposition of the permalloy overlying layer the gap-width decrease $g_0$ is 0.29 μm. Therefore, where the mask pattern gap width $g_1 = 1$ μm, the permalloy pattern gap width $g_2$ is 0.71 μm. On the other hand, according to the present invention, if the thickness $t_C$ of the permalloy overlying layer C is assumed to be 2400 Å (0.24 μm), the decrease ($G_1-G_2$) of the mask pattern gap width caused by the deposition of the overlying layer C is 0.20 μm, and the decrease ($G_2-G_4$) of the permalloy pattern gap width caused by the etching is 0.55 μm, and accordingly, the total gap-width decrease ($G_1-G_4$) is 0.75 μm. Therefore, where the mask pattern initial gap width $G_1 = 1$ μm, the permalloy pattern gap width $G_4$ is 0.25 μm. In this case, the gap-width decrease caused by the deposition of the permalloy overlying layer C is $g_2 - G_4 = 0.71 - 0.25 = 0.46$ μm.

As described above, according to the present invention, the deposition of the overlying layer C makes it possible to form a pattern gap which is remarkably smaller than an initial gap of the mask pattern.

Moreover, according to the present invention, the initial gap width of the mask pattern can be decreased, prior to the etching process, by the deposition of the overlying layer C, and, in addition, a large gap-narrowing effect can be achieved in the etching process. Accordingly, as compared with the conventional method illustrated in FIGS. 3A through 3D, which depends only on the gap-narrowing effect caused by etching, the rate of dependence on the gap-narrowing effect caused by the etching in the present invention is smaller, and thus the overlying layer C can be made thinner, thereby reducing the processing time for layer deposition and etching. Additionally, according to the present invention, since the overlying layer C deposited on the mask pattern is completely etched in the etching process, it is only necessary to remove the mask pattern after the etching has been finished. This removal process is very simple, compared with that of removing both the mask pattern and the pattern gap control layer in the conventional method illustrated in FIGS. 3A through 3D. Consequently, the present invention makes it possible to realize a higher efficiency of production, as compared with the conventional method illustrated in FIGS. 3A through 3D.

As described above, according to the present invention, it is possible to form, stably, very easily, and efficiently, a pattern having submicron gaps, in particular, fine gaps having a width of 0.5 μm or less, by photolithography having a resolution limit of 1 μm, for practical use. Accordingly, the pattern forming method of the present invention can be applied to the various devices as mentioned above for achieving an improvement in the operating chracteristics and a reduction in the size or an increment in the density.

Referring to FIGS. 6A through 6J, an embodiment of the present invention, which is used to manufacture a permalloy bubble memory device, will now be described.

Figure 6A:
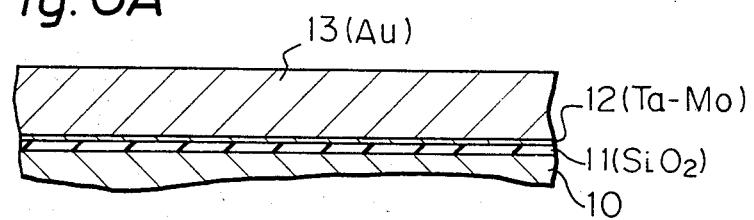
FIGS. 6A through 6J illustrate a process of manufacturing a permalloy magnetic bubble memory device according to the present invention.

(1) First, referring to FIG. 6A, on a substrate (not shown) of non-magnetic garnet, e.g., gadolinium gallium garnet (G.G.G.), a thin layer 10 of magnetic garnet, in which magnetic bubbles can be propagated, is deposited by liquid-phase epitaxial growth. On this magnetic layer, a 500 Å thick SiO₂ layer 11 is deposited by sputtering. Further, a 200 Å thick Ta-Mo alloy layer 12 and a 3800 Å thick Au layer 13, from which a conductor pattern is formed, are successively deposited by vapor deposition.

Figure 6B:
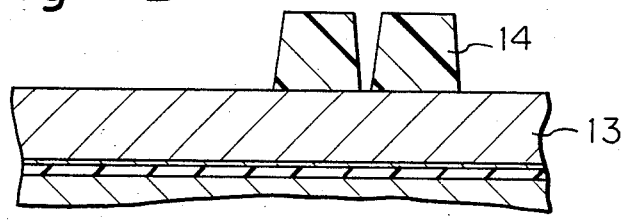
Figure 6C:
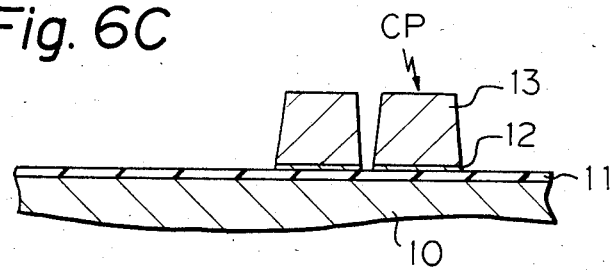

(2) Next, referring to FIG. 6B, on the Au layer 13, a 5000 Å thick etching mask pattern 14 corresponding to the conductor pattern is formed of, for example, a positive photoresist (e.g., AZ1350J) by photolithography.

(3) Thereafter, ion etching is used to pattern the Au layer 13 and the Ta-Mo alloy layer 12, thereby forming a conductor pattern CP(12, 13), and the mask pattern 14 is then removed.

Figure 6D:
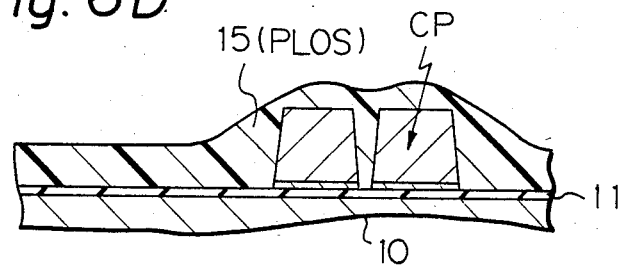

(4) Next, referring to FIG. 6D, a heat-resisting resin (PLOS) layer 15 is deposited over the entire surface to plane the steps defined by the conductor pattern CP.

Figure 6E:
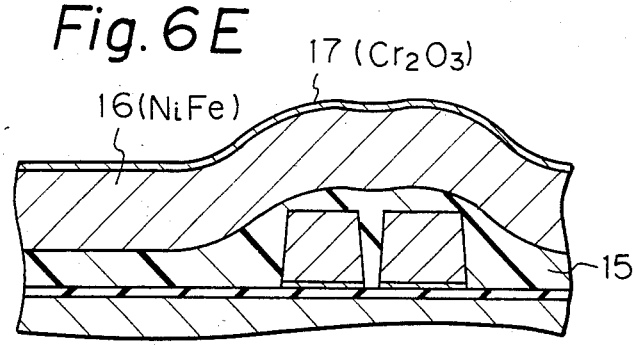

(5) Next, referring to FIG. 6E, a 3000 Å thick permalloy (NiFe) layer 16 (corresponding to the pattern material layer A illustrated in FIG. 4A), from which a permalloy propagation pattern is formed, and a 400 Å thick Cr₂O₃ layer 17, which serves as an anti-reflection coating in the pattern exposure process, are successively deposited by vapor deposition.

Figure 6F:
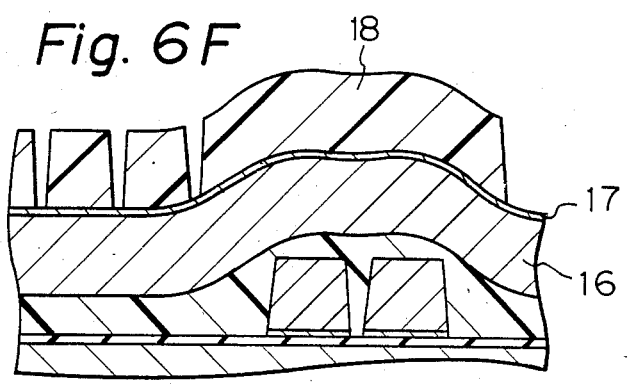

(6) Thereafter, referring to FIG. 6F, on the Cr₂O₃ layer 17, a 10,000 Å thick etching mask pattern 18 (corresponding to the mask pattern B illustrated in FIG. 4A), which substantially corresponds to the permalloy pattern to be formed, is formed of a positive photoresist (e.g., AZ1350J) by photolithography. The smallest gap width of the mask pattern 18 is 1 μm.

Figure 6G:
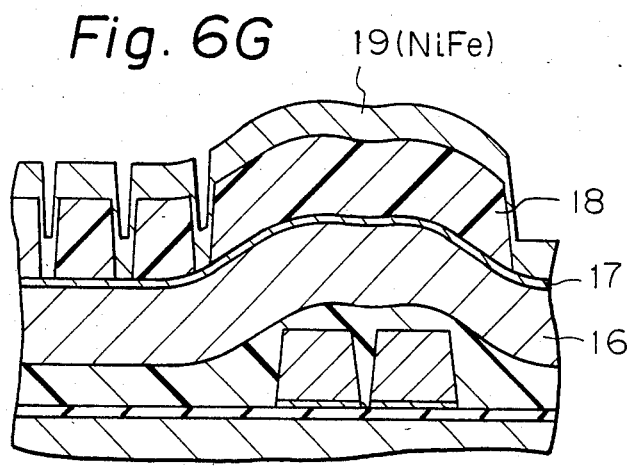

(7) Further, referring to FIG. 6G, over the mask pattern 18, a 2000 Å thick permalloy (NiFe) overlying layer 19 (corresponding to the overlying layer C illustrated in FIG. 4B) is deposited by vapor deposition. In this process, the temperature of the mask pattern is maintained at 150° C. or less to avoid changes in quality and deformation in the mask pattern 18.

Figure 6H:
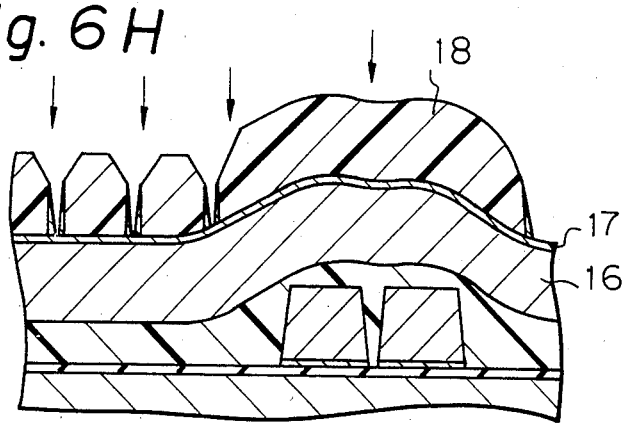

(8) Thereafter, referring to FIG. 6H, ion etching is used to etch the permalloy overlying layer 19, the mask pattern 18, and the Cr₂O₃ layer 17, and the permalloy layer 16, successively.

Figure 6I:
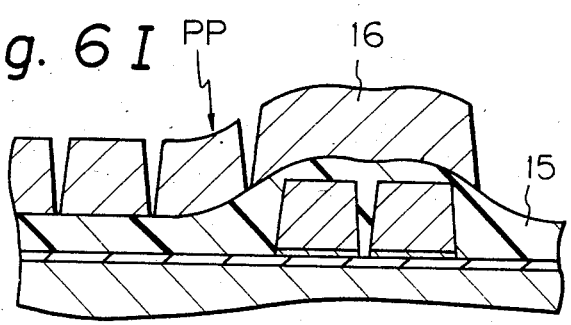

(9) After the etching process, the mask pattern 18 and the Cr₂O₃ layer 17 are removed, whereby a permalloy pattern PP (corresponding to the pattern AP illustrated in FIG. 4E) is formed as illustrated in FIG. 6I. The gap width of the pattern PP is 0.3 μm.

Figure 6J:
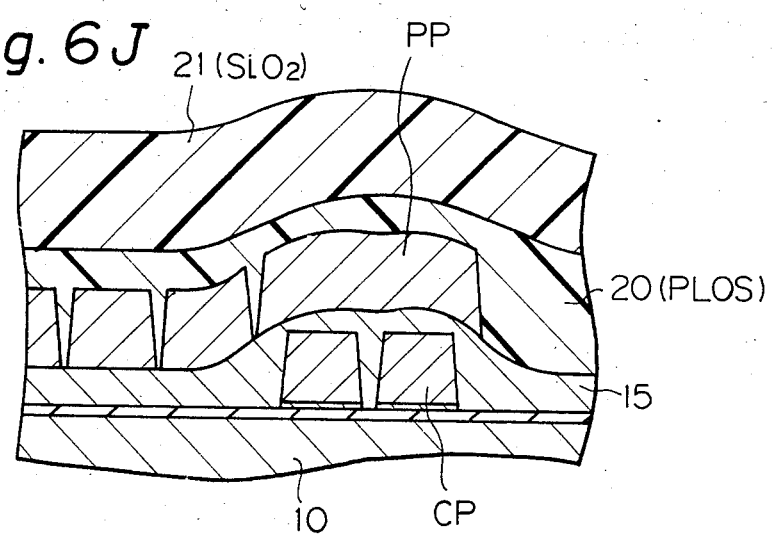

(10) Finally, referring to FIG. 6J, a passivation layer is formed by depositing a 2000 Åm thick heat-resisting resin (PLOS) layer 20 and a 6000 Å thick SiO₂ layer 21, successively.

Figure 7:
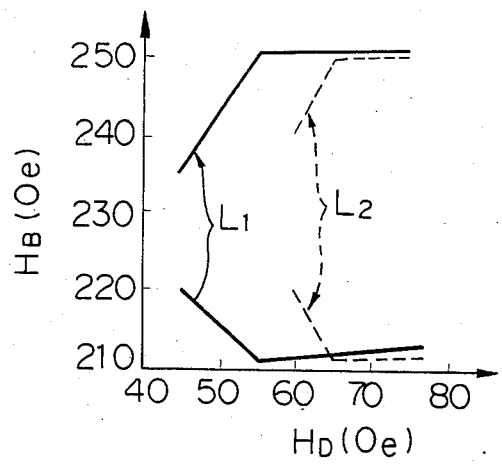
FIG. 7 is a graph illustrating a comparison the characteristics of bubble memory devices manufactured by the present invention and the characteristics of bubble memory devices manufactured by the conventional method.

Referring to FIG. 7, solid lines L₁ and dotted lines L₂ show the bubble propagation characteristics in the magnetic bubble memory devices manufactured according to the present invention method and the conventional method, respectively. In FIG. 7, the abscissa shows the magnetic drive field $H_D$ and the ordinate shows the magnetic bias field $H_B$. These bubble memory devices have permalloy half-disk propagation patterns, both having an 8 μm bit period, and having a 0.3 μm and 1 μm gap width, respectively. From this figure, it can be understood that the bias margins are approximately equal to each other, but the minimum drive field in the device according to the present invention is lower by 15 Oe than that in the conventional device.

It should be noted that, in the above-described embodiment, the present invention can be employed not only for forming the permalloy pattern PP, but also for forming the conductor pattern CP.

On the other hand, the above-described first embodiment of the present invention (FIGS. 4A–4E) has a disadvantage in that the formed pattern is widene over the entire periphery thereof, as compared with the mask pattern. This is particularly disadvantageous when forming the permalloy propagation pattern in the permalloy bubble memory device as described above. For example, in the case of the half-disk pattern illustrated in the plane view of FIG. 8, the formed pattern AP shown by a two-dotted chain line is widened by a size "d" over the entire periphery, as compared with the mask pattern B shown by a solid line. Where the gap width $G_1$ and the leg width W of the mask pattern B are both 1 μm and the pattern-width increase "d" is 0.2 μm, the gap width $G_4$ of the permalloy pattern AP is decreased as $G_1 - 2d = 0.6$ μm, while the pattern leg width $W_1$ is increased as $W + 2d = 1.4$ μm. Although the decrease in gap width contributes to an improvement in bubble propagation characteristics, the increase in pattern leg width gives rise to the problem of the occurrence of the phenomenon wherein a bubble is turned around the pattern leg (i.e., the bubble is not propagated across the pattern gap, but is propagated along the periphery of the pattern leg).

Figure 8:
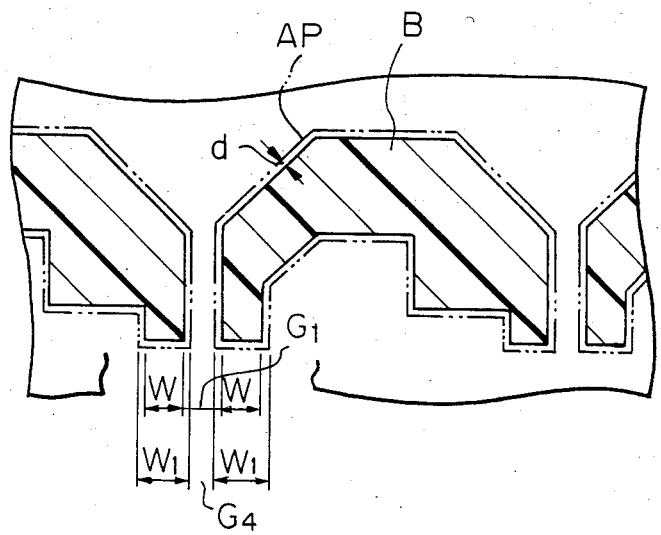
FIG. 8 is a plan view illustrating a disadvantage of a device formed in accordance with the first embodiment of the present invention.

This problem can be solved in alternative embodiments of the present invention, which will be described below by taking, as an example, the forming of the half-disk permalloy pattern illustrated in FIG. 8. Hereinafter, the same or similar portions as those illustrated in FIGS. 4A through 4E are designated by the same reference characters.

Figure 9A:
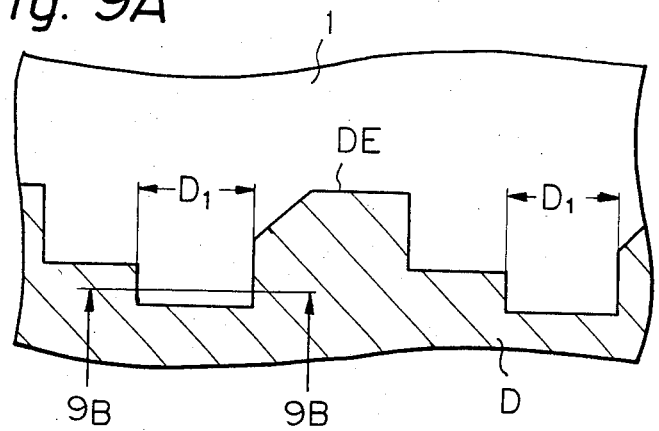
FIGS. 9A through 9H illustrate a second embodiment of the present invention.
Figure 9B:
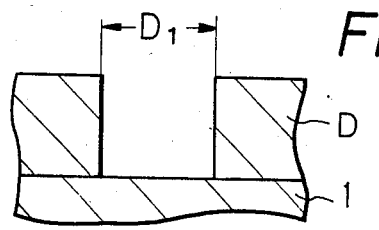

FIGS. 9A through 9G illustrate a process of a second embodiment of the present invention method, which comprises the following steps:

(1) First, referring to the plane view of FIG. 9A and FIG. 9B, which is a sectional view taken along the line 9B—9B in FIG. 9A, on a substrate 1 an underlying mask pattern D is formed prior to forming a permalloy layer, that is, the pattern material layer. The underlying mask pattern D can be formed of any non-magnetic and heat-resisting material which has adhesive characteristics and selective etching characteristics, in relation to the pattern forming material. For example, where the pattern forming material is permalloy, an organic matter (e.g., photoresist, polyimide), Al, Al-Cu alloy, or $SiO_2$ can be used. The underlying mask pattern D is thicker than the pattern material layer and has edges which are patterned to define at least a part of the edges, except for the edges opposite to each other with the pattern gap therebetween, of the pattern to be formed; in particular, a part which is to be prevented from being widened. In the illustrated embodiment, the underlying mask pattern D is an $SiO_2$ layer having a 5000 Å thickness and has an edge DE patterned to correspond to the edge on the concaved side of the mask pattern B illustrated in FIG. 8. In the figures, the reference character $D_1$ designates a region in which the legs of the permalloy pattern are formed.

Figure 9C:
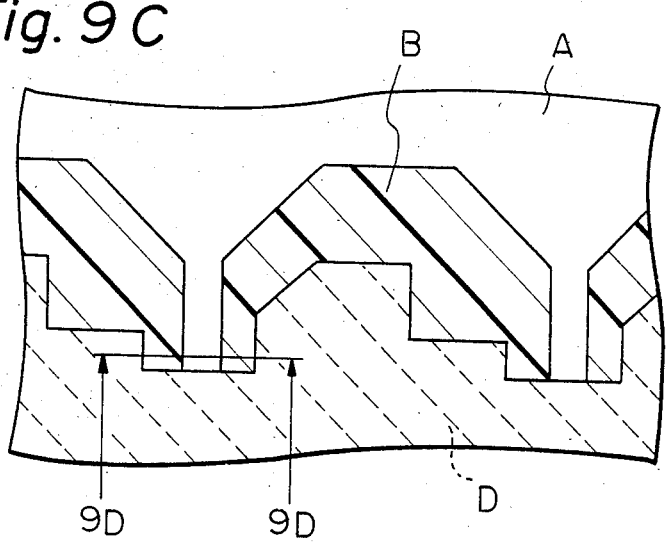
Figure 9D:
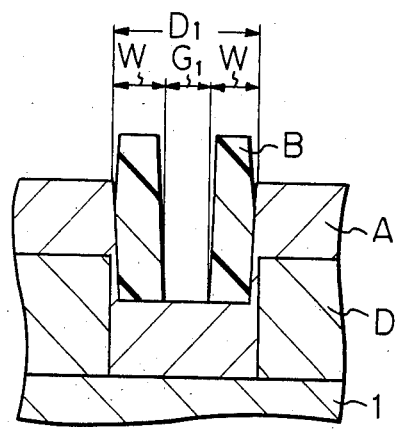

(2) Next, referring to the plane view of FIG. 9C and FIG. 9D, which is a sectional view taken along the line 9D—9D in FIG. 9C, the exposed surfaces of the substrate 1 and the underlying mask pattern D are covered with a 3000 Å thick permalloy layer A deposited thereon by vapor deposition, and successively a 7000 Å thick mask pattern B is formed. The edge on the concaved side of the mask pattern B is aligned with the edge DE of the underlying mask pattern D.

Figure 9E:
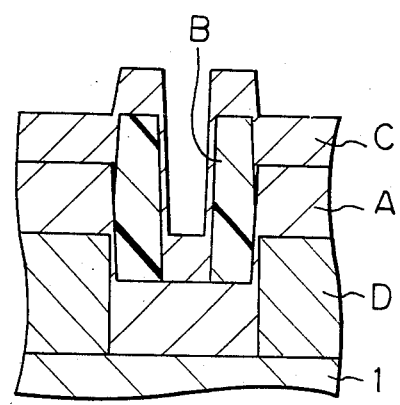

(3) Next, referring to FIG. 9E, over the entire surfaces of the permalloy layer A and the mask pattern B, a 2000 Å thick permalloy overlying layer C is deposited by vapor deposition.

Figure 9F:
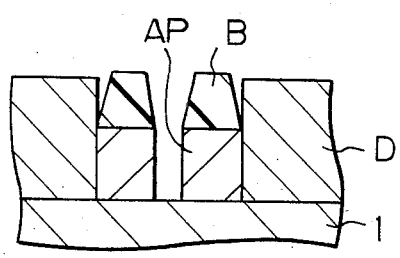
Figure 9G:
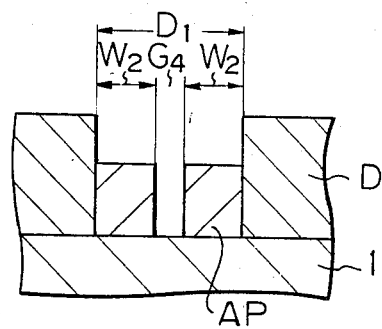

(4) Thereafter, an ion etching process is used to etch the permalloy overlying layer C and the permalloy layer A, thereby forming a permalloy pattern AP, as illustrated in FIG. 9F, and then the mask pattern B is removed as illustrated in FIG. 9G. The underlying mask pattern D can be removed by any etching technique having selective etching characteristics, in relation to the permalloy pattern AP.

Figure 9H:
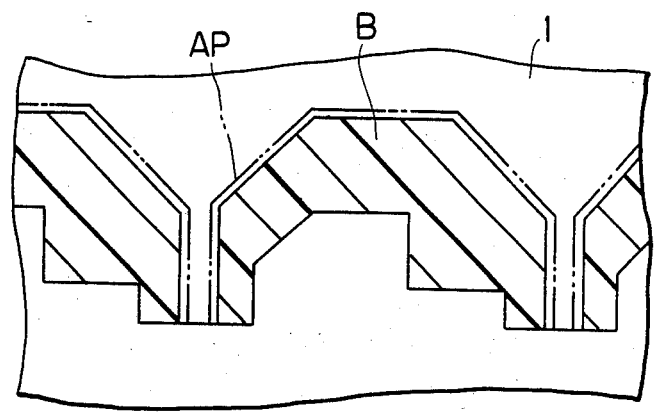

According to the above-described method, as illustrated particularly in FIG. 9H, the permalloy pattern AP is merely widened at the edges with the gap therebetween and at the convexed-side edge, which are not defined by the underlying mask pattern D, but not at the concaved-side edge defined by the underlying mask pattern D. Therefore, where $G_1 = W = 1$ μm and $d = 0.2$ μm, the gap width $G_4$ (FIG. 9G) is a $G_1 - 2d = 0.6$ μm, while the pattern leg width $W_2$ (FIG. 9G) is $W + d = 1.2$ μm, with the result that the increase is halved.

In this embodiment, only the underlying mask pattern only defines the concaved-side edge of the permalloy pattern AP. However, if necessary, an additional underlying mask pattern defining the convexed-side edge of the permalloy pattern AP can be formed to prevent that edge form being widened.

Figure 10A:
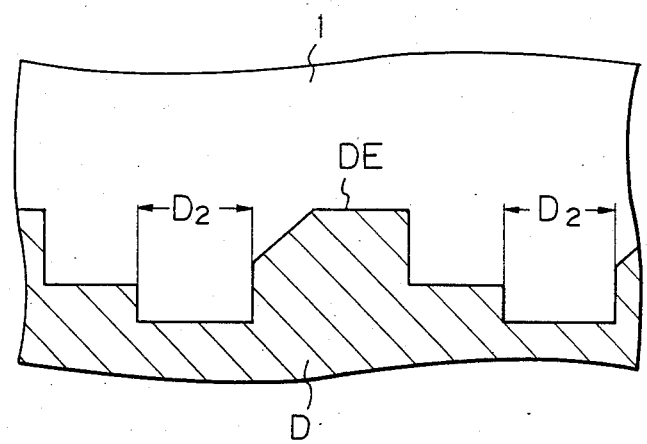
FIGS. 10A through 10I illustrate a third embodiment of the present invention.

According to the above-described second embodiment, however, due to the limitations of photolithography, neither the gap width $G_1$ nor the leg width W of the mask pattern B can be made smaller than 1 μm. Therefore, the width of the region $D_1$ of the underlying mask pattern D must be made larger than 3 μm and, accordingly, the leg width $W_2$ of the permalloy pattern AP must be made larger than 1 μm. This problem can be solved by a third embodiment of the present invention illustrated in FIGS. 10A through 10I, which comprises the following steps:

(1) First, referring to the plan view of FIG. 10A, on the substrate 1 is formed an underlying mask pattern D, which is substantially the same as that in the second embodiment described above, except that the width of a region $D_2$ in which the legs of the half-disk pattern are formed is different, as described hereinafter.

Figure 10B:
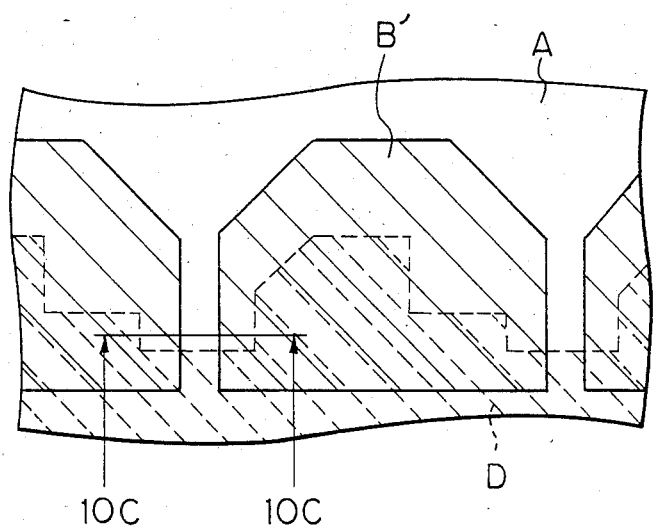
Figure 10C:
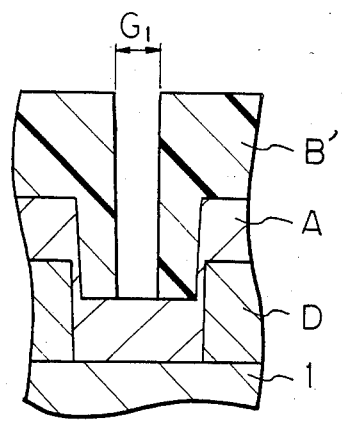

(2) Next, referring to the plan view of FIG. 10B and FIG. 10C, which is a sectional view taken along the line 10C—10C in FIG. 10B, a 3000 Å thick permalloy layer A is deposited and, successively, a mask pattern B' is formed thereon, as in the second embodiment. However, the mask pattern B' is different from the mask pattern B of the second embodiment, in that the thickness of the mask pattern B' is 10,000 Å and it is patterned to overlap the underlying mask pattern D.

Figure 10D:
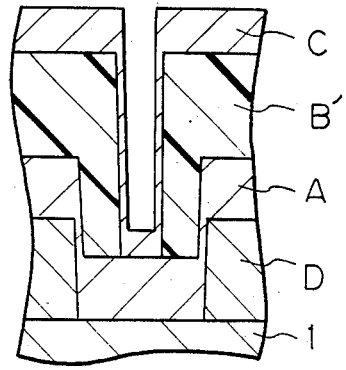

(3) Next, referring to FIG. 10D, a 2000 Å thick permalloy overlying layer C is deposited.

Figure 10E:
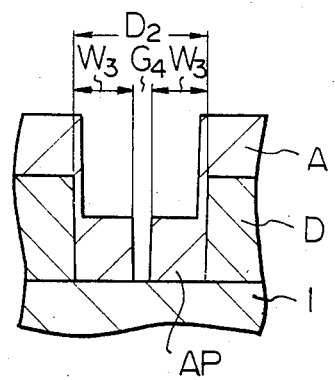
Figure 10F:
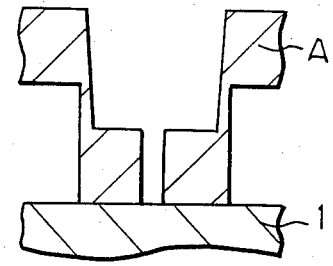
Figure 10G:
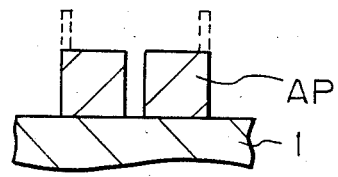
Figure 10H:
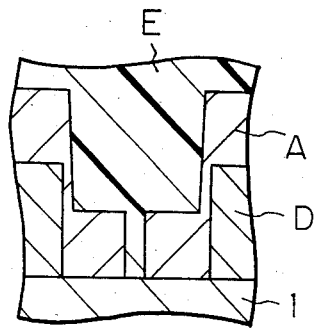
Figure 10I:
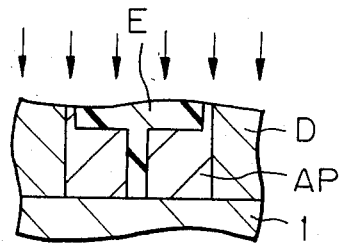

(4) Thereafter, ion etching is performed, and then the mask pattern B' is removed, thereby forming a permalloy pattern AP, as illustrated in FIG. 10E.

(5) Next, if necessary, the useless portion of the permalloy layer A remaining on the underlying mask pattern D is removed. For this purpose, the following two methods may be used. In the first method, referring to FIG. 10F, a selective etching technique is used to remove the underlying mask pattern D only, and then, referring to FIG. 10G, a mechanical technique, such as scraping, for example, is used to remove the useless portion of the permalloy layer A. The selective etching of the underlying mask pattern D can be achieved as follows; where the pattern D is made of an organic matter, by $O_2$ gas plasma etching; in case where the pattern D is formed of Al, by using an alkali etchant or an etchant containing phosphoric acid as the chief ingredient; and, in the case where the pattern D is formed of $SiO_2$, by $CF_4$ as plasma etching. In the second method, referring to FIG. 10H, a resin E is deposited over the entire surface of the article being in the condition illustrated in FIG. 10E for planing, and then, referring to FIG. 10I, ion etching is performed to etch the entire surface, thereby removing the useless portion of the permalloy layer A, together with the resin E.

According to the method described above, the edges of the legs of the permalloy pattern AP, which are not defined by the underlying mask pattern D, are widened, thereby forming a submicron gap, as in the above-described second embodiment. Moreover, the mask pattern B' is formed, with the gap width $G_1$ limited merely to 1 μm, due to the limitation of the photolithography, and accordingly, the width of the region $D_2$ of the underlying mask pattern D illustrated in FIG. 10A can be made smaller than 3 μm. Therefore, it is possible to previously reduce the width of the region $D_2$ by a size corresponding to the increase in pattern width, thereby preventing the pattern leg width from being increased. For example, if the width of the region $D_2$ is $G_1+2(W-d)=2.6$ μm, the pattern gap width $G_4$ illustrated in FIG. 10E is $G_1-2d=0.6$ μm, and the pattern leg width $W_3$ is $(2.6-0.6)/2 = 1$ μm. Namely, an increase does not occur. It is also possible to reduce the pattern leg width $W_3$ to less than 1 μm, if the width of the region is further reduced. Furthermore, in this third embodiment, if necessary, it is also possible to form an additional underlying mask pattern defining the convexed-side edge of the half-disk pattern, to prevent that edge from being widened.

Figure 11A:
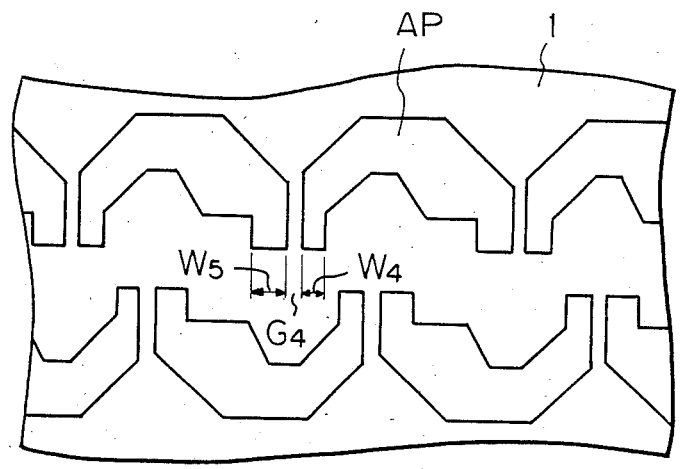
FIGS. 11A through 11H illustrate a fourth embodiment of the present invention.
Figure 11B:
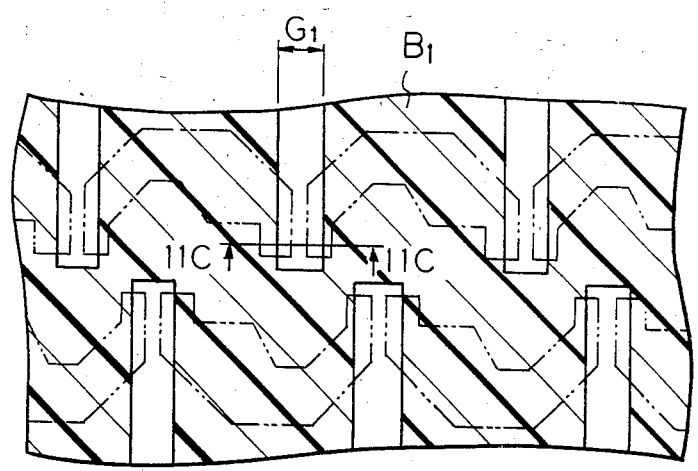
Figure 11C:
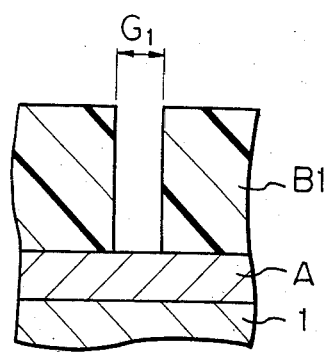

A fourth embodiment of the present invention will now be described. This embodiment makes it possible to form a half-disk permalloy pattern AP as illustrated in the plan view of FIG. 11A, in which the gap width is $G_4=0.3$ μm and the pattern leg widths are $W_4=0.5$ μm and $W_5=0.7$ μm, without using an underlying mask pattern as described above, and comprises the following steps:

(1) First, referring to the plan view of FIG. 11B and FIG. 11C, which is a sectional view taken along the line 11C—11C in FIG. 11B, on a substrate 1 is formed a 3000 Å thick permalloy layer A, and successively a 10,000 Å thick mask pattern B1 is formed. However, unlike the mask pattern B or B' in the aforementioned embodiments, the mask pattern B1 is patterned to expose only than the regions corresponding to the positions of the gaps of the pattern AP to be formed (the ultimate position of the pattern AP being illustrated in FIG. 11B by the two-dotted chain line). In other words, the mask pattern B1 is merely provided with gaps substantially corresponding to the gaps of the pattern AP. The gap width $G_1$ of the mask pattern is 1 μm.

Figure 11D:
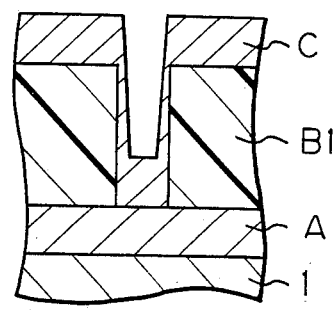
Figure 11E:
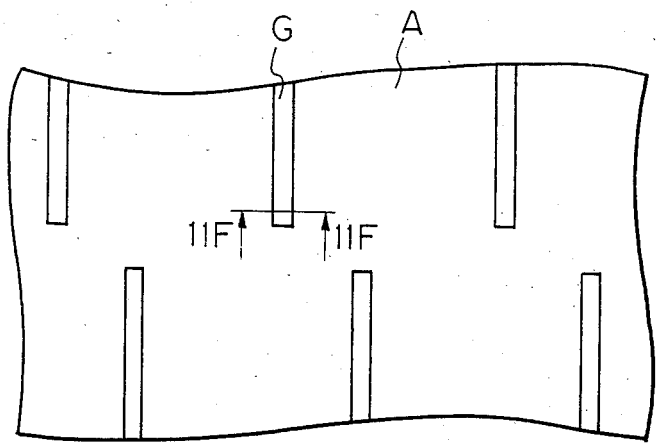
Figure 11F:
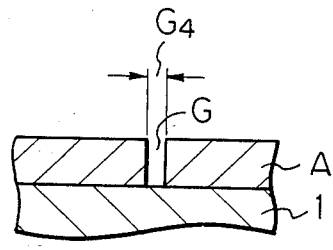

(2) Next, referring to FIG. 11D, a 3000 Å thick permalloy overlying layer C is deposited. (3) Thereafter, the permalloy overlying layer C and the permalloy layer A are etched by ion etching, and then the mask pattern B1 is removed, whereby, as illustrated in the plan view of FIG. 11E and FIG. 11F, which is a sectional view taken along the line 11F—11F in FIG. 11E, gaps G having a width $G_4=0.3$ μm are formed in the permalloy layer A.

Figure 11G:
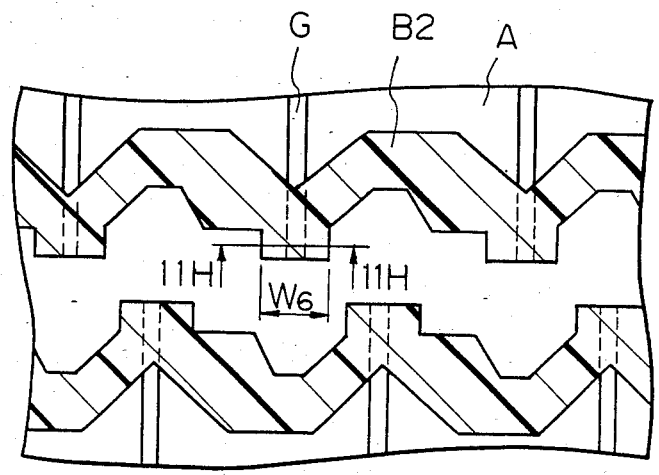
Figure 11H:
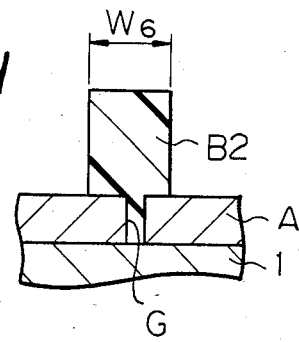

(4) Subsequently, referring to the plan view of FIG. 11G and FIG. 11H, which is a sectional view taken along the line 11H—11H in FIG. 11G, on the permalloy layer A formed with the gaps G is formed a 7000 Å thick mask pattern B2 which covers the regions corresponding to the gaps G and the pattern AP. In other words, the mask pattern B2 has a configuration such that the pattern AP is continued at the gaps. The width $W_6$ of the pattern-connecting portion of the mask pattern B2 is: $W_6=W_4+W_5+G_4=1.5$ μm.

(5) Thereafter, the permalloy pattern A is etched and the mask pattern B2 is removed, thereby forming the permalloy pattern AP as illustrated in FIG. 11A.

According to the above-described method, the mask patterns in which the smallest size is 1 μm or more, and which can be formed by photolithography, can be employed for forming a fine pattern in which all of the gap width $G_4$ and the leg widths $G_4$ and $G_5$ are smaller than 1 μm.

Figure 12A:
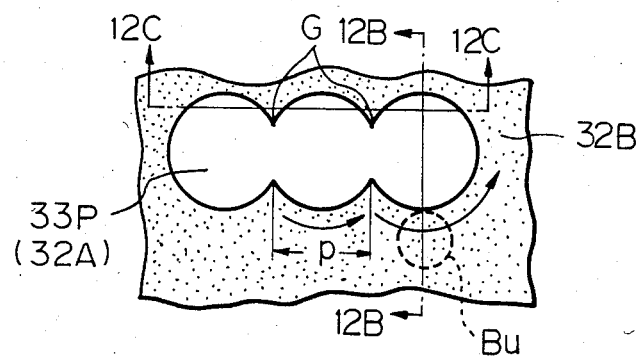
Figure 12B:
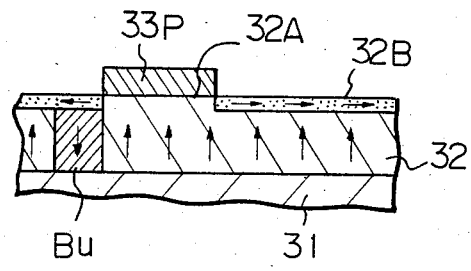
Figure 12C:
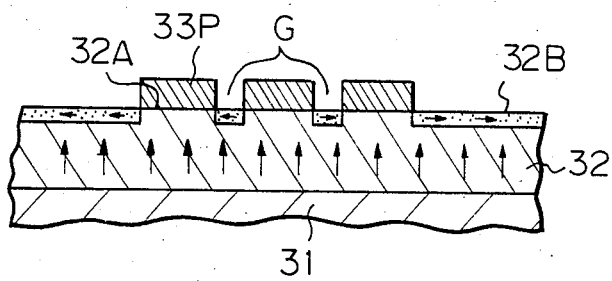

Next, an embodiment of the present invention which is used to manufacture a contiguous-disk bubble propagation pattern in an ion-implanted bubble memory device will be described. First, the ion-implanted bubble memory device is briefly described with reference to FIGS. 12A through 12C wherein FIG. 12A is a partial plan view of the device, and FIGS. 12B and 12C are sectional views taken along the lines 12B—12B and 12C—12C in FIG. 12A, respectively. In these figures, the reference numeral 31 designates a substrate (G.G.G.) of the bubble memory device, 32 a magnetic garnet thin film in which magnetic bubbles can be propagated, and 32A a contiguous-disk bubble propagation pattern. In the outer region 32B surrounding the pattern 32A, ions are implanted on the surface of the magnetic film 32 to a depth which is equal to about 30% of the thickness of the magnetic film 32 so that the direction of magnetization is normal to the plane in the region of the pattern 32A, while being parallel to the plane in the outer region 32B. When an external in-plane reorienting magnetic field is applied to this pattern, a bubble Bu is propagated along the periphery of the contiguous-disk pattern 32A, due to the movement of the charged wall. The contiguous-disk pattern 32A has cusps G which define bubble trap positions. The distance p between the adjacent cusps defines the pattern period or bit period.

For ion-implantation in the region 32B, an ion-implantation mask pattern 33P is employed, which is made of, for example, Au, and corresponds to the shape of the contiguous-disk pattern 32A. A conventional process for forming the mask pattern 33P comprises steps of, first, forming on an Au layer an etching mask pattern corresponding to the pattern 33P by photolithography, and, next, etching the Au layer. However, where p is less than 2 μm, the cusp G has a very fine configuration and it is difficult to form it precisely or sharply.

Figure 13A:
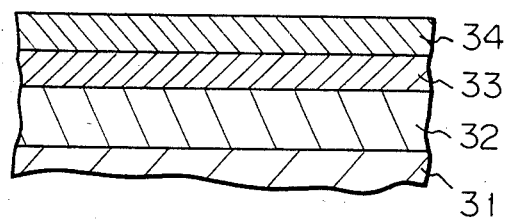
FIGS. 13A through 13G illustrate a basic process of a method for forming a mask pattern for the ion-implantation, which is a fifth embodiment of the present invention.
Figure 13B:
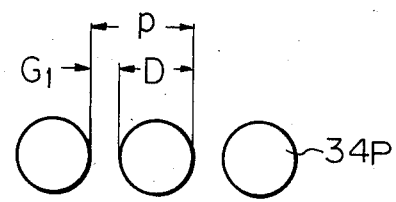
Figure 13C:
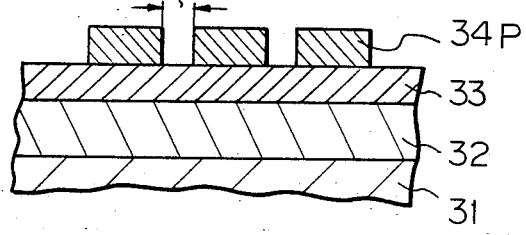
Figure 13D:
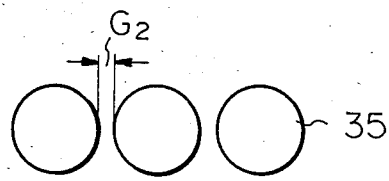
Figure 13E:
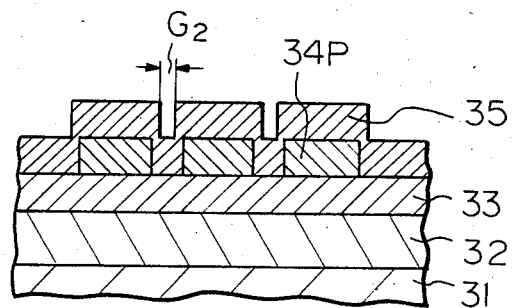
Figure 13F:
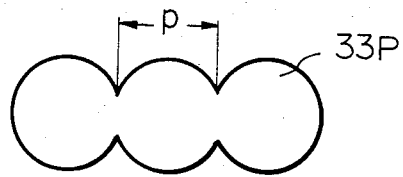
Figure 13G:
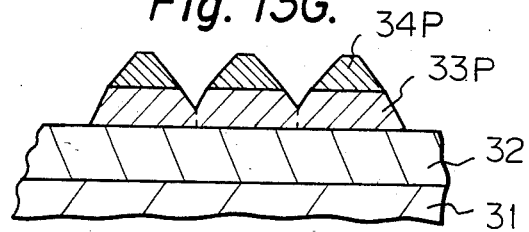

Such a fine cusp can be formed according to the present invention which will be described below with reference to FIGS. 13A, 13C, 13E and through 13D, wherein FIGS. 13A through 13G illustrate sectional views in the successive steps of the method; FIGS. 13B, 13D and 13F illustrate plan views of the pattern.

(1) First, referring to FIG. 13A, on the surface of the magnetic garnet thin film 32, a 6000 Å thick Au layer 33 (corresponding to the pattern material layer A illustrated in FIG. 4A), from which the ion-implantation mask pattern 33P is formed, and a 6000 Å thick photoresist layer 34 are successively deposited.

(2) Next, referring to FIG. 13B, photolithography is used to pattern the photoresist layer 34, thereby forming an etching mask pattern 34P (corresponding to the mask pattern B illustrated in FIG. 4A) which is constituted of independent disk patterns. Where p=2 μm and the photolithographic resolution is 1 μm, the mask pattern 43P can be formed to have a disk diameter D of 1 to 1.25 μm and a gap width G of 0.75 to 1.0 μm.

(3) Next, referring to FIG. 13C, a 6000 Å thick Cu or NiFe overlying layer 35 (corresponding to the overlying layer C illustrated in FIG. 4B), that is a pattern-widening layer, is deposited by vapor deposition. The overlying layer 35 contributes to the widening of the mask pattern 34P, thereby forming a gap width $G_2$ which is less than $G_1$.

(4) Thereafter, ion etching is performed to etch the overlying layer 35, the etching mask pattern and the Au layer 33, thereby forming a contiguous-disk mask pattern 33P, as illustrated in FIG. 13D, in which the disk patterns are overlapped or joined to one another, due to the pattern-widening effect as described above.

(5) Subsequently, the mask pattern 34P is removed, and, thereafter, ions are implanted in the magnetic garnet thin film 32, using the mask pattern 33P as a mask, whereby the contiguous-disc bubble propagation pattern 32A as illustrated in FIGS. 12A through 12C is formed.

As described above, according to the present invention, a discontiguous-disc pattern, which can be easily formed by photolithography having a 1 μm resolution, is used as a basis, and the pattern-widening effect caused by deposition of the overlying layer and ion etching is utilized to widen the pattern and form a contiguous-disc pattern. Accordingly, cusps G having a fine configuration can be precisely formed, whereby it is possible to realize a high-density ion-implanted contiguous-disk bubble propagation pattern having a period of 2 μm or less.

Figure 14A:
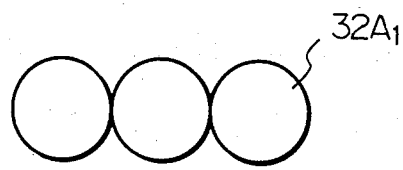
FIGS. 14A and 14B illustrate two variations of the contiguous-disk pattern.
Figure 14B:
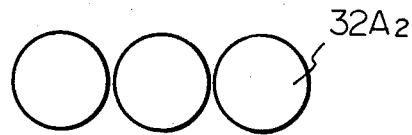

The contiguous-disk pattern 32A in the above-described embodiment is a typical example of a contiguous-disk pattern, in which the disk patterns overlap each other. The "contiguous-disk pattern" is also defined to include a pattern $32A_1$, illustrated in FIG. 14A, in which the disk patterns are in contact with each other at their circumferences, and a pattern $32A_2$, illustrated in FIG. 14B, in which the disk patterns are spaced with fine gaps therebetween. In pattern $32A_2$, the permissable limit gap width of the is approximately half that of the diameter of a bubble to be propagated. The above-mentioned embodiment is that of a typical disk pattern which can be most easily formed; however, the present invention can be applied to a different kind of pattern, such as an oval pattern or square pattern.

Now, with reference to FIGS. 15A through 15E, a method according to the present invention for forming a pattern adapted to enable an easy planing process will be described below. FIGS. 15A through 15E illustrate the main steps in a process of forming a permalloy bubble propagation pattern of a magnetic bubble memory device, wherein the same reference characters as those in FIGS. 4A through 4E are used, since the only difference lies in the materials used for some of the layers. In the figures, the reference numeral 1 generally designates a base of the device, which is formed by, first a magnetic garnet thin film, e.g, a bubble propagation layer is formed on a substrate of non-magnetic garnet (G.G.G.), then, a conductor pattern is formed on the bubble propagation layer with an insulating layer of $SiO_2$ or resin therebetween, and, finally, an insulating layer of $SiO_2$ or resin is deposited on the conductor pattern. A process of forming a permalloy pattern on the base 1 is as follows.

Figure 15:
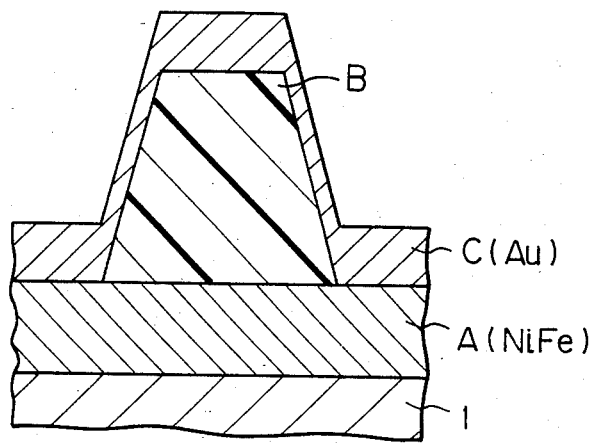
FIGS. 15A through 15E illustrate a basic process of a method for forming a pattern adapted to facilitate the planing process, which is a sixth embodiment of the present invention.
Figure 15:
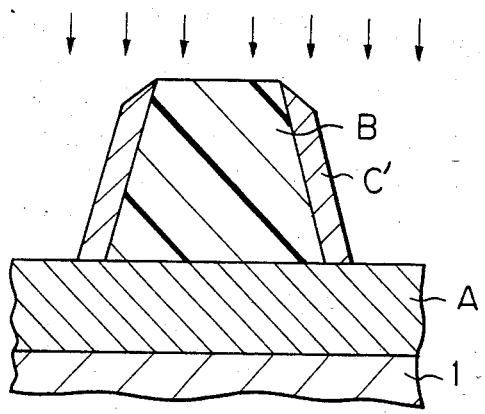

(1) First, referring to FIG. 15A, on the base 1 is deposited a 3000 Å thick permalloy layer A, that is, the pattern material layer, on which a 7000 Å thick photoresist mask B pattern is formed by photolithography. Furthermore, an overlying layer C is deposited on the exposed surfaces of the permalloy layer A and the mask pattern B, so that the undulation of the mask pattern B is substantially maintained. The overlying layer C is made of a material, for example, Au, which has an etching rate larger than that of the material of the mask pattern B, and is formed by vapor deposition or sputtering. In the case of vapor deposition, it is desirable to maintain a low temperature (for example, 150° C. or less) to prevent the mask pattern B from changes in quality and configuration. In this embodiment, the overlying layer C is made of Au and has a 2000 Å thickness.

(2) Next, the overlying layer C and the permalloy layer A are etched by using an ion etching technique employing an inert gas, such as Ne, Ar, or Xe. In this process, at the stage when a portion of the overlying layer C on the surface of the permalloy layer A has been etched until the surface of the permalloy layer A is exposed, as illustrated in FIG. 15B, the etched material (Au) of the overlying layer C is redeposited on the sides of the mask pattern B as designated by the reference character C', thereby forming a wide mask pattern having a complex structure composed of the mask pattern B of a photoresist and the layers C' of the overlying layer material (Au), which each have a different etching rate.

Figure 15C:
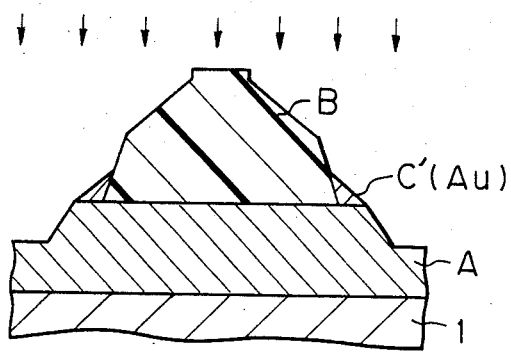

(3) When ion etching is continued, the layers C' of overlying layer material (Au) are etched faster than the permalloy layer A and the mask pattern B, according to the ratio of etching rate between permalloy, Au, and photoresist, for example, 1:3 through 4:1, where Ar is used as the energized particles and an incident angle of the energized particles with respect to the normal line of the base is 0°. Therefore, an intermediate state in the etching process is as illustrated in FIG. 15C.

Figure 15D:
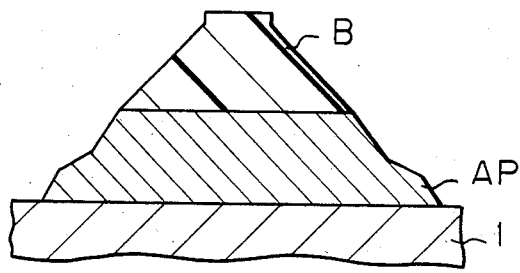
Figure 15E:
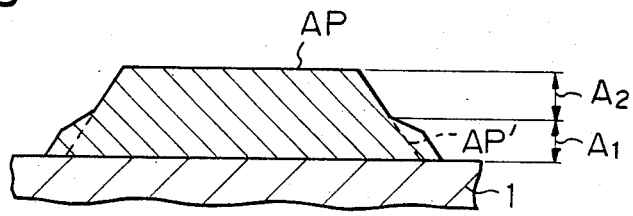

(4) When ion etching is further continued, a permalloy pattern AP is formed as illustrated in FIG. 15D, and thereafter, the mask pattern B is removed as illustrated in FIG. 15E.

As can be easily understood from the above, the permalloy pattern AP has a sectional configuration with stepped edges, each having a portion $A_1$ etched with the layer C' of the overlying layer material used as the mask, and a portion $A_2$ etched with the mask pattern B used as the mask. As compared with the sectional configuration of a pattern AP' (shown by dotted lines) where the overlying layer C is not deposited and the resist pattern B only is used as the mask, the sectional configuration of the pattern AP is widened in the portion $A_1$ and is stepped, thereby being reduced in slope. Accordingly, the planing process of depositing a resin, for example, can be easily performed.

The angle of slope of the pattern side surface depends on the kind of material (i.e., etching rate) and the thickness of the overlying layer C, as well as the incidence angle of the etching particles with respect to the normal line of the base. For example, where the overlying layer C is made of Au and has a 2000 Å thickness and the incidence of etching particles forms an oblique angle with the normal line of the base, the slope of the pattern side surface is reduced to an extent of 45° through 50°, in contrast to the extent of 60° through 65° according to a conventional method.

As described above, according to the present invention, there is provided a pattern forming method in which a sectional configuration of the pattern can be controlled by depositing an overlying layer on the mask pattern and by using an ion-etching technique. According to this method, a pattern having gently sloping side surfaces, and thus easily adapted for the planing process, can be easily formed, whereby it is possible to improve the reliability of various devices, such as a magnetic bubble memory device.

It should be noted that although the above-described embodiment is that of forming the permalloy pattern, the present invention can be used to form a conductor pattern of a bubble memory device.

Next, an apparatus used for carrying out the above-described pattern-forming method according to the present invention will be described. As described above, the present invention essentially comprises a step of forming an overlying layer on an etching mask pattern, and an ion etching step. However, if using conventional apparatus, two separate apparatuses, i.e., a film-layer forming apparatus and an etching apparatus, must be used to carry out the overlying layer forming step and the etching step, respectively. In this case, there is a problem in that the surface of layer of film on the substrate is contaminated with minute particles. That is, a flow of air is produced in the film layer forming apparatus, e.g., vapor deposition or sputtering apparatus, when a vacuum chamber in an evacuated condition is restituted to an atmospheric pressure condition after a film layer has been formed, and in the next etching apparatus, when an vacuum chamber in an atmospheric pressure condition is evacuated. This air flow causes minute particles adhering to the inner wall of the vacuum chamber to be scattered, and thereby to adhere to the surface of a layer formed on the substrate. This factor is critical, in particular, when forming a submicron gap pattern. Moreover, there is another problem in that the use of separate apparatuses is expensive and the process takes a long time.

The present invention provides a vacuum apparatus which is provided with both a film layer forming means and an etching means, thereby enabling the above-described film layer forming step and etching step to be successively performed by using one and the same apparatus without a break in the vacuum condition.

Figure 16:
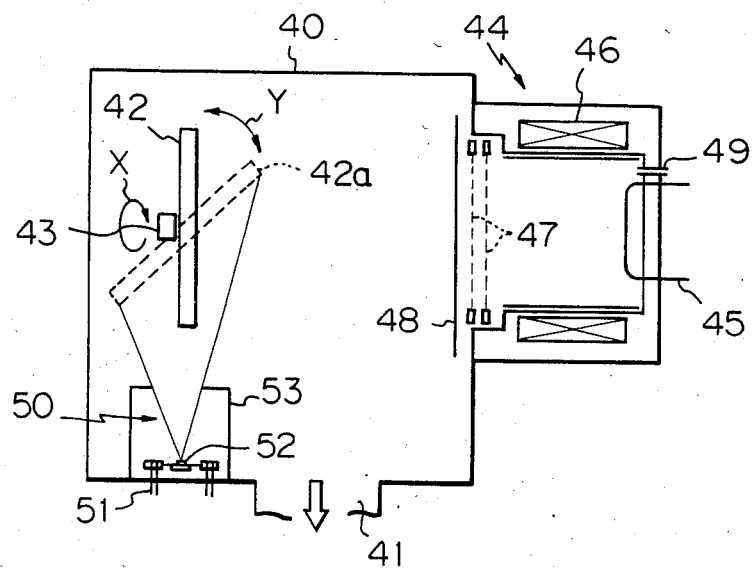
FIGS. 16 and 17 schematically illustrate first and second embodiments of an apparatus according to the present invention.

FIG. 16 illustrates a structure of an embodiment of a vacuum apparatus according to the present invention. This apparatus is constructed by incorporating a vapor deposition apparatus into a known ion etching apparatus. In the figure, the reference numeral 40 designates a vacuum chamber with an evacuation outlet 41 connected to a diffusion pump (not illustrated). The vacuum chamber 40 is provided with a substrate holder 42 carried by a carriage (not shown). On the surface of the holder 42, substrates (not shown), on each of which a pattern is to be formed, are held in, for example, a circular arrangement. The substrate holder 42 can be rotated in the direction of the arrow X by means of a motor 43 and also can be tilted by 45° to a position 42a, shown by a dotted line, by means of another motor (not shown). Reference numeral 44 designates a known ion etching apparatus comprising a cathode 45, a magnet 46, a grid 47, and a neutralizer 48. An inert gas, such as Ne, Ar, or He, is supplied into the apparatus through a gas inlet 49, whereby ion beams are generated. Reference numeral 50 designates a vapor deposition apparatus, 51 electrical leads for the electrical source, and 52 a vapor source. When a layer or film is formed on the substrate, the substrate holder 42 is tilted by 45° to the dotted-line position 42a. The vapor deposition apparatus 50 is surrounded by a dust-proof cover 53 having an opening opposite to the substrate holder 42. This cover prevents the vaporized material from adhering to the inner wall of the vacuum chamber 40. Accordingly, there is no possibility of the scattering of minute particles caused by a flow of air introduced or evacuated, thereby preventing contamination of the layer on the substrate.

In the use of this vacuum apparatus for carrying out the pattern forming method according to the present invention, a substrate on which a mask pattern has been formed is set on the substrate holder 42. Next, the substrate holder 42 is tilted to the dotted-line position (i.e., film layer forming position) 42a and then, the vapor deposition apparatus 50 is used to form a layer of film on the substrate. Thereafter, the substrate holder 42 is returned to the solid-line position (i.e., etching position) and then, the ion etching apparatus 44 is used to perform the etching. In this manner, the film layer forming step and the successive etching step can be successively carried out by using one and the same apparatus without a break in the vacuum condition, whereby the film layer on the substrate can be prevented from being contaminated with minute particles, and the process time can be shortened.

Figure 17:
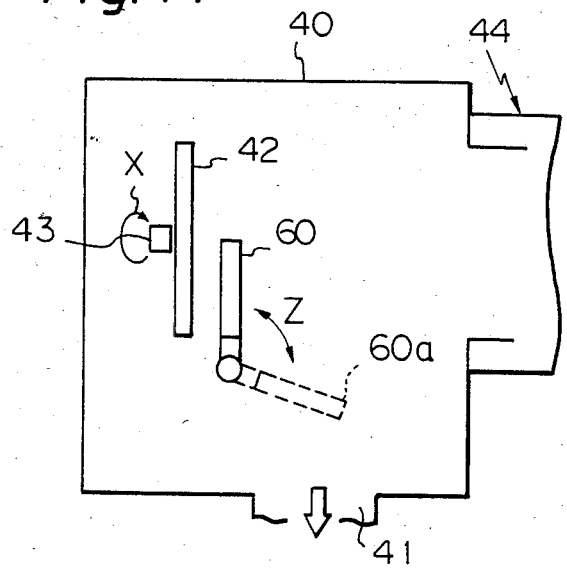

FIG. 17 illustrates another embodiment of a vacuum apparatus according to the present invention, in which the only difference from the first embodiment is that it is provided with a sputtering apparatus instead of the vapor deposition apparatus. Namely, a target 60 rotatable in the direction of arrow Z is disposed in front of the substrate holder 42. In the layer forming step, the target 60 is held in a solid-line position (i.e., sputtering position) between the substrate holder 42 and the ion etching apparatus 44, in which the ion etching apparatus 44 is used to etch the target 60, thereby forming an overlying layer on the substrate by sputtering. Thereafter, the target 60 is rotated to a dotted-line position (i.e., etching position) 60a and then, the ion etching apparatus 44 is used to etch the layers on the substrate. In this manner, as in the first embodiment, the film layer forming step and the etching step can be successively carried out in a short time without a break in the vacuum condition.

Moreover, in addition to the illustrated embodiments, an apparatus of the type in which a load-lock system is used to carry out the vapor deposition within a preliminary chamber (i.e., separate room) may be used.

As described above, according to the vacuum apparatus of the present invention, it is possible to successively carry out the overlying layer forming step and the etching step in the above-described pattern forming method, by using one and the same apparatus without a break in the vacuum condition. Consequently, a high quality device not contaminated with minute particles can be manufactured in a short time, whereby a remarkable improvement in the production rate and a reduction in cost can be achieved.

We claim:

1. A method for forming a pattern having a fine gap on a substrate, comprising the steps of:
    (a) depositing a layer of a pattern material on the surface of said substate;
    (b) forming an etching mask pattern having a first gap on said pattern material layer;
    (c) depositing a pattern-widening overlying layer which substantially maintains the topography of the mask pattern on the exposed surfaces of said pattern material layer and on the mask pattern, thereby forming a second gap which is smaller than the first gap; and
    (d) etching said overlying layer and said pattern material layer by ion etching employing energized particles of an inert gas, thereby forming said pattern having said fine gap which is smaller than said second gap from said pattern material layer.

2. A method according to claim 1, wherein step (b) includes forming said mask pattern from a photersist material by photolithography.

3. A method according to claim 1, wherein step (c) includes depositing said overlying layer by vapor deposition.

4. A method according to claim 3, wherein step (c) includes performing the vapor deposition of said overlying layer in a direction which forms an oblique angle with a line normal to the surface of said substrate.

5. A method according to claim 1, wherein step (c) includes depositing said overlying layer by sputtering.

6. A method according to claim 1, wherein step (c) includes forming said overlying layer of a material which is different from the material of said pattern material layer.

7. A method according to claim 1, wherein step (c) includes forming said overlying layer of a material which is the same as the material of said pattern material layer.

8. A method according to claim 1, wherein step (a) includes depositing a permalloy (NiFe) pattern material layer, and wherein step (d) includes forming a permalloy pattern for magnetic bubble propagation in a magnetic bubble memory device.

9. A method according to claim 8, wherein step (c) includes depositing a copper (Cu) overlying layer.

10. A method according to claim 8, wherein step (c) includes depositing a permalloy (NiFe) overlying layer.

11. A method according to claim 1, wherein step (b) includes forming said first gap of the mask pattern with a width of approximately 1 $\mu$m or more, and step (d) includes forming the gap of said pattern with a width of less than approximately 0.5 $\mu$m.

12. A method for forming a pattern having a fine gap on a substrate, comprising the steps of:
(a) forming an underlying mask pattern having a thickness on the surface of said substrate, said underlying mask pattern having an edge defining a part of an edge portion of said pattern, except for the edge portions of said pattern which define said gap therebetween;
(b) depositing a layer of a pattern material having a thickness which is less than the thickness of the underlying mask pattern on the exposed surface of said substrate and said underlying mask pattern;
(c) forming an etching mask pattern having a first gap on said pattern material layer;
(d) depositing a pattern-widening overlying layer which substantially maintains the topography of the mask pattern on the exposed surfaces of said pattern material layer and the etching mask pattern thereby forming a second smaller gap which is smaller than the first gap;
(e) etching said overlying layer and said pattern material layer by ion etching employing energized particles of an inert gas, thereby forming said pattern having said fine gap from said pattern material layer, said fine gap being smaller than said second gap.

13. A method according to claim 12, wherein step (c) includes forming said etching mask pattern on a portion of said underlying mask pattern which is formed on said pattern material layer, further comprising the step (f) of removing a useless portion of the pattern material layer remaining on the underlying mask pattern after step (e).

14. A method according to claim 13, wherein step (a) includes forming said underlying mask pattern of a material having selective etching characteristics with respect to the etching characteristics of the pattern material layer, further comprising the sequential steps of removing the underlying layer by etching after step (f), and removing a useless portion of the pattern material layer remaining on the underlying mask pattern.

15. A method according to claim 13, further comprising the sequential steps of depositing a covering material on the exposed surfaces of the substrate to create a planar exposed surface, and removing a useless portion of the pattern material layer remaining on the underlying mask pattern and said covering material by etching.

16. A method for forming a pattern having a fine gap on a substrate, comprising the steps of:
(a) forming a layer of a pattern material on the surface of said substrate;
(b) forming a first etching mask pattern having a first gap on said pattern material layer;
(c) depositing an overlying layer which substantially maintains the topography of the first etching mask on the exposed surfaces of said pattern material layer and said first mask pattern, thereby forming a second gap which is smaller than the first gap;
(d) etching said overlying layer and said pattern material layer by ion etching employing energized particles of an inert gas, thereby forming said fine gap which is smaller than said second gap in said pattern material layer;
(f) forming a second mask pattern on the pattern material layer having said fine gap, so as to cover said fine gap and the region corresponding to said pattern to be formed; and
(g) etching the exposed region of said pattern material layer to form said pattern.

17. A method for forming a contiguous-element pattern including pattern elements on a substrate, so that adjacent pattern elements have a fine gap therebetween, comprising the steps of:
(a) depositing a layer of pattern material on the surface of said substrate;
(b) forming an etching mask pattern having a first gap on said pattern material layer;
(c) depositing a pattern-widening overlying layer which substantially maintains the topography of the mask pattern on the exposed surfaces of said pattern material layer and the mask pattern, thereby forming a second gap which is smaller than the first gap; and
(d) etching said overlying layer and said pattern material layer by ion etching employing energized particles of an inert gas, thereby forming said contiguous-element pattern from said pattern material layer.

18. A method according to claim 17, wherein said contiguous-element pattern is a contiguous disk pattern, and wherein step (b) includes forming a discontiguous-disk etching mask pattern.

19. A method for forming a contiguous-element pattern for magnetic bubble propagation, comprising the steps of (a) forming an ion-implantation mask pattern on a surface of a magnetic thin film in which magnetic bubbles can be propagated, and (b) implanting ions in the exposed surface of said magnetic thin film, wherein said step (a) comprises the substeps of:
(1) depositing a layer of pattern material on the surface of said magnetic thin film;
(2) forming an etching mask pattern having a first gap on said mask pattern material layer;
(3) depositing a pattern-widening overlying layer which substantially maintains the topography of the etching mask pattern on the exposed surfaces of said mask pattern material layer and said etching mask pattern, thereby forming a second gap which is smaller than said first gap; and
(4) etching said overlying layer and said mask pattern material layer by ion etching employing energized particles of an inert gas, thereby forming said ion-implantation mask pattern from said mask pattern material layer.

20. A method according to claim 19, wherein substep (2) includes forming a discontiguous-disk etching mask pattern, and wherein step (a) includes forming a contiguous-disk ion-implantation mask pattern.

21. A method according to claim 19, wherein step (a) inlcudes forming a contiguous-disk ion-implantation mask pattern having a pattern period of 2 μm or less.

22. A method according to claim 19, wherein step (a) includes forming said contiguous-disk ion-implantation mask pattern layer of gold (Au).

23. A method according to claim 22, wherein substep (3) includes depositing an overlying layer of copper (cu).

24. A method according to claim 22, wherein substep (3) includes depositing an overlying layer of permalloy (NiFe).

25. A method forming a pattern of a material on a substrate, comprising the steps of:
  (a) depositing a layer of said pattern material on the surface of said substrate;
  (b) forming an etching mask pattern of a material having a first etching rate on portions of said material layer substantially corresponding to said pattern to be formed;
  (c) depositing an overlying layer of material having a second etching rate which is larger than the first etching rate of the material of said mask pattern on the exposed surfaces of said pattern material layer and the mask pattern overlying layer substantially maintaining the topography of the etching mask pattern; and
  (d) etching said overlying layer and said pattern material layer by ion etching employing energized particles of an inert gas, thereby forming said pattern from said pattern material layer.

26. A method according to claim 25, wherein step (c) includes depositing an overlying layer of gold (Au).

* * * * *

UNITED STATES PATENT AND TRADEMARK OFFICE
CERTIFICATE OF CORRECTION

PATENT NO. : 4,597,826

DATED : July 1, 1986

INVENTOR(S) : Majima et al.

It is certified that error appears in the above-identified patent and that said Letters Patent is hereby corrected as shown below:

```
[57] ABSTRACT, line 13, "planing" should be --planning--.

Col. 1, line 21, "for and" should be --and for--.

Col. 2, line 17, "planing" should be --planning--;
        line 23, "planing" should be --planning--.

Col. 3, line 25, delete "And that";
        line 26, "further" should be --Further--;
        line 39, "planing" should be --planning--;
        line 46, "Another" should begin a new paragraph.

Col. 4, line 59, "shortering" should be --shortening--.

Col. 5, line 4, after "comparison" insert --between--;
        line 31, "planing" should be --planning--;
        line 45, delete "of" (1st occurrence);
        line 48, delete "of a gap";
        line 55, delete "of a gap";
        line 62, "company" should be --Company--.
```

UNITED STATES PATENT AND TRADEMARK OFFICE
CERTIFICATE OF CORRECTION

PATENT NO.   :   4,597,826

DATED        :   July 1, 1986

INVENTOR(S)  :   Majima et al.

It is certified that error appears in the above-identified patent and that said Letters Patent is hereby corrected as shown below:

Col. 7, line 4, "anagolize" should be --analogize--;
       line 50, "width" should be --width $G_4$--;
       line 51, "delete "$G_4$--.

Col. 9, line 38, delete "as";
       line 39, "chracteristics" should be --characteristics--.

Col. 10, line 21, delete "and the permalloy";
        line 22, delete "layer 16,";
        line 29, "$\overset{\bullet}{A}m$" should be --$\overset{\bullet}{A}$--;
        line 52, "widene" should be --widened--.

Col. 11, line 40, "plane" should be --plan--.

Col. 12, line 58, "planing" should be --planning--.

Col. 13, line 33, delete "than";
        line 41, "(3)..." should start a new paragraph.

UNITED STATES PATENT AND TRADEMARK OFFICE
CERTIFICATE OF CORRECTION

PATENT NO. : 4,597,826

DATED : July 1, 1986

INVENTOR(S) : Majima et al.

It is certified that error appears in the above-identified patent and that said Letters Patent is hereby corrected as shown below:

Col. 14, line 38, delete ", 13C, 13E and";
         line 39, change "13A" to --13A, 13C, 13E and 13G--; delete "through 13D".

Col. 15, line 26, "permissa-" should be --permissi- --;
         line 36, "planing" should be --planning--.

Col. 16, line 38, "planing" should be --planning--;
         line 57, "planing" should be --planning--.

Col. 18, line 62, "photersist" should be --photoresist--.

Col. 21, line 9, "inlcudes" should be --includes--;
         line 16, "(cu)" should be --(Cu)--.

Signed and Sealed this

Fourteenth Day of October, 1986

[SEAL]

Attest:

DONALD J. QUIGG

*Attesting Officer*       *Commissioner of Patents and Trademarks*